United States Patent
Anderson et al.

(10) Patent No.: US 6,571,184 B2
(45) Date of Patent: May 27, 2003

(54) SYSTEM AND METHOD FOR DETERMINING THE DECOUPLING CAPACITORS FOR POWER DISTRIBUTION SYSTEMS WITH A FREQUENCY-DEPENDENT TARGET IMPEDANCE

(75) Inventors: Raymond E. Anderson, Santa Cruz, CA (US); Larry D. Smith, San Jose, CA (US); Tanmoy Roy, Mountain View, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 141 days.

(21) Appl. No.: 09/778,602

(22) Filed: Feb. 6, 2001

(65) Prior Publication Data

US 2002/0107647 A1 Aug. 8, 2002

(51) Int. Cl.[7] .......................... G06F 19/00; G01R 27/00
(52) U.S. Cl. ......................................... 702/65; 702/106
(58) Field of Search .......................... 702/65, 106, 191; 703/14, 18; 324/650, 654; 361/306.2, 782

(56) References Cited

U.S. PATENT DOCUMENTS

| | | | | |
|---|---|---|---|---|
| 4,835,464 A | * | 5/1989 | Slye et al. | 324/763 |
| 5,883,814 A | | 3/1999 | Luk et al. | |
| 6,385,565 B1 | * | 5/2002 | Anderson et al. | 703/18 |

OTHER PUBLICATIONS

Hubing et al., "Power Bus Decoupling on Multilayer Printed Circuit Boards," May 1995, pp. 155–166.
Chen et al., "On–Chip Decoupling Capacitor Optimization for High–Performance VLSI Design," May 1995, pp. 99–103.
Drewniak et al., "Modeling Power Bus Decoupling on Multilayer Printed Circuit Boards," Aug. 1994, pp. 456–461.
"High–end Digital Systems Give a Thumbs Down to Rules of Thumb", Green, *EDN*, Jun. 5, 2000.

* cited by examiner

*Primary Examiner*—Bryan Bui
(74) *Attorney, Agent, or Firm*—B. Noël Kivlin; Meyertons, Hood, Kivlin, Kowert & Goetzel, P.C.

(57) ABSTRACT

A system and method for determining the desired decoupling capacitors for power distribution systems having frequency dependent target impedance. In one embodiment, the target impedance may be a function of frequency, and thus may vary in value over a frequency range from 0 Hz to a corner frequency. A specific quantity of decoupling capacitors may be selected to provide decoupling for the power distribution for a given frequency within the frequency range. A total impedance provided by the specific quantity of selected decoupling capacitors may be calculated and compared to the calculated target impedance for the given frequency. If the total impedance provided by the specific quantity of selected decoupling capacitors is greater than the target impedance for the given frequency, the impedance may be adjusted by changing the quantity of capacitors. Capacitors may continue to be added until the total impedance is less than the target impedance. This may be performed for one or more frequencies within the calculated frequency range.

31 Claims, 11 Drawing Sheets

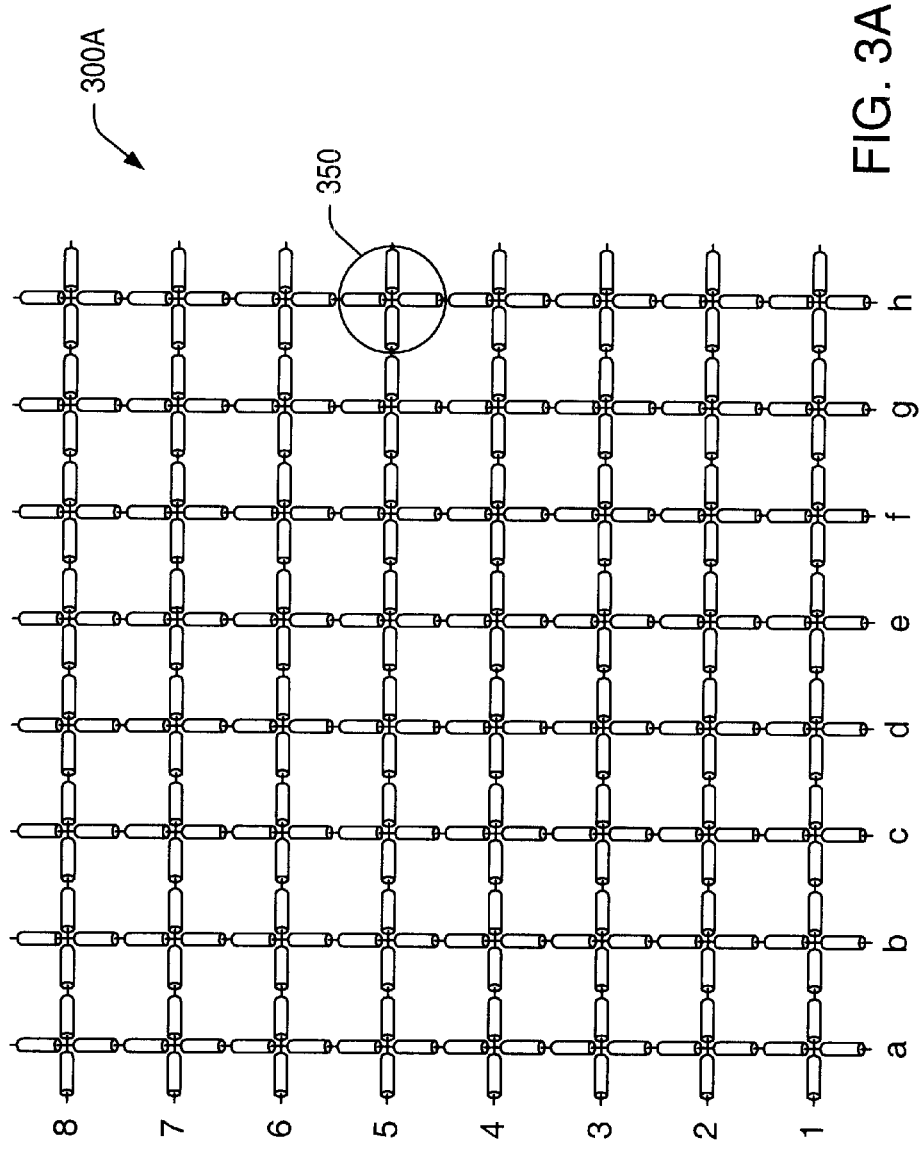

SYSTEM AND METHOD FOR DETERMINING THE DECOUPLING CAPACITORS FOR POWER DISTRIBUTION SYSTEMS WITH A FREQUENCY-DEPENDENT TARGET IMPEDANCE

BACKGROUND OF THE INVENTION

1. Field of the Invention

This invention relates to electronic systems, and more particularly to electrical interconnecting apparatus having continuous planar conductors.

2. Description of the Related Art

Electronic systems typically employ several different types of electrical interconnecting apparatus having planar layers of electrically conductive material (i.e., planar conductors) separated by dielectric layers. A portion of the conductive layers may be patterned to form electrically conductive signal lines or "traces". Conductive traces in different layers (i.e., on different levels) are typically connected using contact structures formed in openings in the dielectric layers (i.e., vias). For example, integrated circuits typically have several layers of conductive traces which interconnect electronic devices formed upon and within a semiconductor substrate. Each layer is separated from adjacent layers by dielectric layers. Within a semiconductor device package, several layers of conductive traces separated by dielectric layers may be used to electrically connect bonding pads of an integrated circuit to terminals (e.g., pins or leads) of the device package. Printed circuit boards (PCBs) also typically have several layers of conductive traces separated by dielectric layers. The conductive traces are used to electrically interconnect terminals of electronic devices mounted upon the PCB.

Signals in digital electronic systems typically carry information by alternating between two voltage levels (i.e., a low voltage level and a high voltage level). A digital signal cannot transition instantaneously from the low voltage level to the high voltage level, or vice versa. The finite amount of time during which a digital signal transitions from the low voltage level to the high voltage level is called the rise time of the signal. Similarly, the finite amount of time during which a digital signal transitions from the high voltage level to the low voltage level is called the fall time of the signal.

Digital electronic systems are continually being produced which operate at higher signal frequencies (i.e., higher speeds). In order for the digital signals within such systems to remain stable for appreciable periods of time between transitions, the rise and fall times of the signals must decrease as signal frequencies increase. This decrease in signal transition times (i.e., rise and fall times) creates several problems within digital electronic systems, including signal degradation due to reflections, power supply "droop", ground "bounce", and increased electromagnetic emissions. It is desirable that the digital signals are transmitted and received within accepted tolerances.

A signal launched from a source end of a conductive trace suffers degradation when a portion of the signal reflected from a load end of the trace arrives at the source end after the transition is complete (i.e., after the rise time or fall time of the signal). A portion of the signal is reflected back from the load end of the trace when the input impedance of the load does not match the characteristic impedance of the trace. When the length of a conductive trace is greater than the rise time divided by three, the effects of reflections upon signal integrity (i.e., transmission line effects) should be considered. If necessary, steps should be taken to minimize the degradations of signals conveyed upon the trace due to reflections. The act of altering impedances at the source or load ends of the trace in order to reduce signal reflections is referred to as "terminating" the trace. For example, the input impedance of the load may be altered to match the characteristic impedance of the trace in order to prevent signal reflection. As the transition time (i.e., the rise or fall time) of the signal decreases, so does the length of trace which must be terminated in order to reduce signal degradation.

A digital signal alternating between the high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of $\pi$ times the transition time (i.e., rise or fall time) of the signal. For example, a digital signal with a 1 nanosecond transition time has a frequency content extending up to about 318 MHz.

All conductors have a certain amount of inductance. The voltage across the inductance of a conductor is directly proportional to the rate of change of current through the conductor. At the high frequencies present in conductors carrying digital signals having short transition times, a significant voltage drop occurs across a conductor having even a small inductance. A power supply conductor connects one terminal of an electrical power supply to a power supply terminal of a device, and a ground conductor connects a ground terminal of the power supply to a ground terminal of the device. When the device generates a digital signal having short transition times, high frequency transient load currents flow in the power supply and ground conductors. Power supply droop is the term used to describe the decrease in voltage at the power supply terminal of the device due to the flow of transient load current through the inductance of the power supply conductor. Similarly, ground bounce is the term used to describe the increase in voltage at the ground terminal of the device due to the flow of transient load current through the inductance of the ground conductor. When the device generates several digital signals having short transition times simultaneously, the power supply droop and ground bounce effects are additive. Sufficient power supply droop and ground bounce can cause the device to fail to function correctly.

Power supply droop is commonly reduced by arranging power supply conductors to form a crisscross network of intersecting power supply conductors (i.e., a power supply grid). Such a grid network has a lower inductance, hence power supply droop is reduced. A continuous power supply plane may also be provided which has an even lower inductance than a grid network. Placing a "bypass" capacitor near the power supply terminal of the device is also used to reduce power supply droop. The bypass capacitor supplies a substantial amount of the transient load current, thereby reducing the amount of transient load current flowing through the power supply conductor. Ground bounce is reduced by using a low inductance ground conductor grid network, or a continuous ground plane having an even lower amount of inductance. Power supply and ground grids or planes are commonly placed in close proximity to one another in order to further reduce the inductances of the grids or planes.

Electromagnetic interference (EMI) is the term used to describe unwanted interference energies either conducted as currents or radiated as electromagnetic fields. High frequency components present within circuits producing digital signals having short transition times may be coupled into nearby electronic systems (e.g., radio and television circuits), disrupting proper operation of these systems. The United States Federal Communication Commission has established upper limits for the amounts of EMI products for sale in the United States may generate.

Signal circuits form current loops which radiate magnetic fields in a differential mode. Differential mode EMI is usually reduced by reducing the areas proscribed by the circuits and the magnitudes of the signal currents. Impedances of power and ground conductors create voltage drops along the conductors, causing the conductors to radiate electric fields in a common mode. Common mode EMI is typically reduced by reducing the impedances of the power and ground conductors. Reducing the impedances of the power and ground conductors thus reduces EMI as well as power supply droop and ground bounce.

Within the wide frequency range present within electronic systems with digital signals having short transition times, the electrical impedance between any two parallel conductive planes (e.g., adjacent power and ground planes) may vary widely. The parallel conductive planes may exhibit multiple electrical resonances, resulting in alternating high and low impedance values. Parallel conductive planes tend to radiate a significant amount of differential mode EMI at their boundaries (i.e., from their edges). The magnitude of differential mode EMI radiated from the edges of the parallel conductive planes varies with frequency and is directly proportional to the electrical impedance between the planes.

FIG. 1 is a perspective view of a pair of 10 in.×10 in. square conductive planes 110 and 120 separated by a fiberglass-epoxy composite dielectric layer. Each conductive plane is made of copper and is 0.0014 in. thick. The fiberglass-epoxy composite layer separating the planes has a dielectric constant of 4.0 and is 0.004 in. thick. If a 1 ampere constant current is supplied between the centers of the rectangular planes, with a varying frequency of the current, the magnitude of the steady state voltage between the centers of the rectangular planes can be determined 130.

The electrical impedance between the parallel conductive planes of FIG. 1 varies widely at frequencies above about 200 MHz. The parallel conductive planes exhibit multiple electrical resonances at frequencies between 100 MHz and 1 GHz and above, resulting in alternating high and low impedance values. The parallel conductive planes of FIG. 1 would also radiate substantial amounts of EMI at frequencies where the electrical impedance between the planes anywhere near their peripheries is high.

The above problems are currently solved in different ways at different frequency ranges. At low frequency, the power supply uses a negative feedback loop to reduce fluctuations. At higher frequencies, large value bypass (i.e. decoupling) capacitors are placed near devices. At the highest frequencies, up to about 200–300 MHz, very small bypass capacitors are placed very close to devices in an attempt to reduce their parasitic inductance, and thus high frequency impedance, to a minimum value. By Nov. 2, 1994, the practical upper limit remained around 200–300 MHz as shown by Smith [Decoupling Capacitor Calculations for CMOS Circuits; pp. 101–105 in Proceedings of 3$^{rd}$ Topical Meeting on Electrical Performance of Electronic Packaging of the Institute of Electrical and Electronics Engineers, Inc.].

The power distribution system was modeled as shown in FIG. 2. A switching power supply 210 supplies current and voltage to a CMOS chip load 220. In parallel with the power supply 210 and the load 220 are decoupling capacitors 215 and the PCB 225 itself, with its own capacitance. Smith [1994] teaches that decoupling capacitors are only necessary up to 200–300 MHz, as the target impedances are rarely exceeded above that frequency. This upper limit changes over time as the clock frequencies increase and the allowable voltage ripple decreases. Determining the proper values for decoupling capacitors and the optimum number of each has been a "trial and error" process, which relies on the experience of the designer. There are no known straightforward rules for choosing decoupling capacitors for all frequency ranges.

Additionally, current methods of choosing decoupling capacitors typically rely on a constant target impedance over a wide frequency range. The assumption that the target impedance should be constant for all frequencies may be overly conservative. Such an overly conservative assumption may result in extra capacitors being added to the power distribution system, particularly for higher frequencies.

SUMMARY OF THE INVENTION

The problems outlined above are in large part solved by a system and method for determining the desired decoupling capacitors for power distribution systems having frequency dependent target impedance. In one embodiment, the target impedance may be a function of frequency, and thus may vary in value over a frequency range from 0 Hz to a corner frequency. A specific quantity of decoupling capacitors may be selected to provide decoupling for the power distribution for a given frequency within the frequency range. A total impedance provided by the specific quantity of selected decoupling capacitors may be calculated and compared to the calculated target impedance for the given frequency. If the total impedance provided by the specific quantity of selected decoupling capacitors is greater than the target impedance for the given frequency, the impedance may be adjusted by changing the quantity of capacitors. Capacitors may continue to be added until the total impedance is less than the target impedance for the selected frequencies. This may be performed for one or more frequencies within the calculated frequency range.

In one embodiment, the calculation of the corner frequency may depend upon a frequency of a clock signal and a frequency component of the clock signal rise time. The frequency component of the clock signal rise time may be determined using the following formula:

$$F_{eq}=0.35/T_{RISE},$$

where $F_{eq}$ is known as the equivalent frequency (the frequency component of the clock signal rise time) and $T_{RISE}$ is the rise time of the clock signal. If the frequency of the clock signal is on the same order of magnitude as the equivalent frequency, then the corner frequency is equal to the equivalent frequency. If the equivalent frequency calculation is of a higher order of magnitude than the frequency of the clock signal, the corner frequency may be calculated by the formula $F_C=0.125*F_{CLK}$, where $F_C$ is the corner frequency and $F_{CLK}$ is the clock frequency.

After determining the corner frequency, the computer system may be configured to determine the target impedance for one or more frequencies. Target impedance may be calculated for frequencies above or below the corner frequency, although those frequencies below the corner frequency may be of the greater concern. For any given frequency, the target impedance may be calculated by the formula $$Z_T(f)=Z_{DC}*[1+(f/F_C)],$$

where $Z_T(f)$ is the target impedance as a function of frequency, f is the frequency variable, $F_C$ is the corner frequency, and $Z_{DC}$ is the target impedance at a frequency of 0 Hz (also referred to as the beginning impedance). The formula provides a target impedance that is a continuous function of frequency. By inspection of the above formula, it can be seen that the target impedance will increase as frequency increases, with a noticeable increase as frequency increases above the target impedance.

A computer system may be used for performing the determination of decoupling capacitors for the power distribution system. In one embodiment, a computer system is configured for inputting a model of an electronic circuit, such as a SPICE model, into a computer system. The computer system may determine a frequency range for determining the decoupling capacitors based upon a calculation of the corner frequency. The computer system may also select decoupling capacitors for the electronic circuit. The capacitors may be selected from a database including characteristic values for a plurality of capacitors. The computer system may also be configured to determine a physical location of placement for each of the decoupling capacitors within the electronic circuit. The selected locations may correspond with locations that are selected for calculating transfer impedance values. Once the capacitors have been selected from the database, and their physical location in the circuit has been determined, the model of the electronic circuit may be updated to reflect the addition of the capacitors. The computer system may then simulate operation of the electronic circuit in order to determine the transfer impedance values at the selected locations in the electronic circuit. The computer system may then compare the calculated transfer impedance values which were calculated for selected frequencies to the calculated target impedance for the selected frequencies. If the transfer impedance values are above the target impedance, the computer system may then update the model to reflect the addition of decoupling capacitors to the circuit until the transfer impedance is less than or equal to the target impedance.

Thus, the system and method described herein may allow for the determination of the decoupling capacitors for a power distribution system based upon a frequency dependent target impedance. Since target impedance increases as frequency increases, fewer capacitors may be required to suppress noise at higher frequencies. Thus, the number of decoupling capacitors required to meet specifications of the electronic circuit may be reduced.

BRIEF DESCRIPTION OF THE DRAWINGS

Other objects and advantages of the invention will become apparent upon reading the following detailed description and upon reference to the accompanying drawings in which:

FIG. 3A is a top view of one embodiment of a model of a power distribution system;

Figure 1:
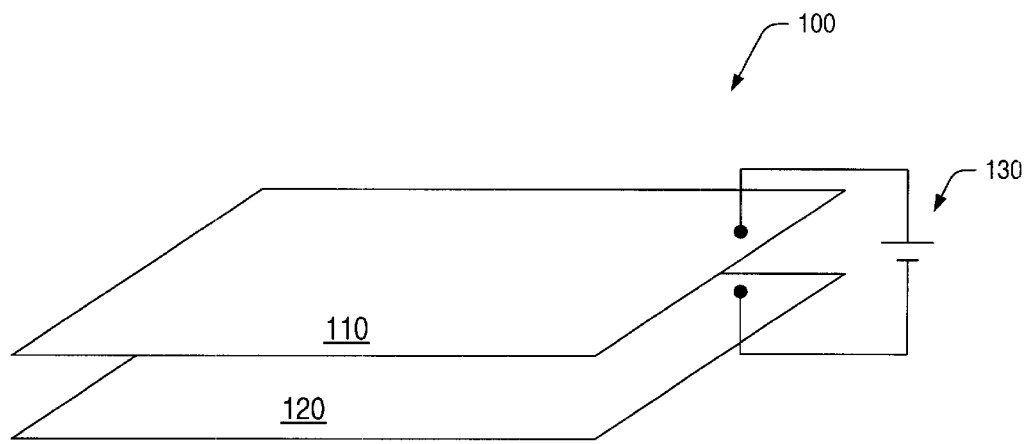
FIG. 1 is a perspective view of a representative electrical interconnecting apparatus comprising a prior art pair of 10 in.×10 in. square conductive planes separated by a fiberglass-epoxy composite dielectric layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 3—Power Distribution System Model

FIG. 3A is a top view of a simplified schematic of one embodiment of a model of a power distribution system for an electronic circuit. As shown, the model comprises a grid 300A of transmission line segments. The segments are grouped into unit cells 350. As shown, there are eight columns labeled "a" through "h", as well as eight rows labeled, from the bottom to the top, "1" through "8". The model preferably comprises a SPICE array of transmission lines in a fixed topology (i.e. in an 8×8 grid). The transmission lines may be of variable lengths such that the fixed topology may be used on electrical connecting device of any physical dimensions. It is noted that other embodiments of the power distribution system are contemplated, such as an elliptical model based on a "wheel and spoke" geometry.

Figure 3B:
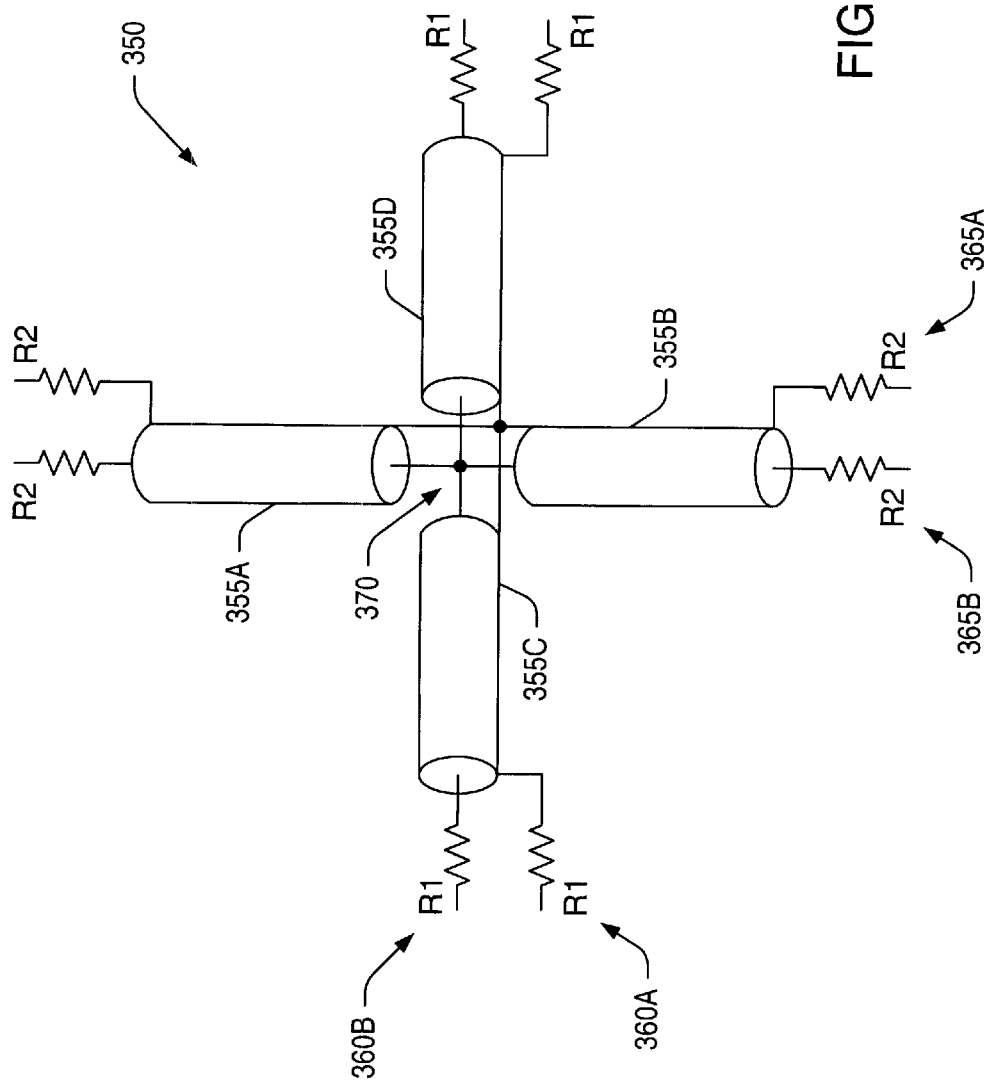
FIG. 3B is an embodiment of a unit cell of the power distribution system model shown in FIG. 3A.

FIG. 3B illustrates a close up view of the unit cell 350 from FIG. 3A. As shown, the unit cell 350 may be comprised of four transmission lines 355A–355D. The four transmission lines 355 connect together at nodal point pair 370, also referred to as node 370. As shown, connections to the center conductors represent plane 1, while connections to shield are plane 2. Note that the model is balanced, therefore either plane 1 or plane 2 may be power or ground, as desired. Transmission lines 355A and 355B are preferably described with a width impedance "$Z_W$" and a width time delay "$t_{DW}$". Transmission lines 355C and 355D are preferably described with a length impedance "$Z_L$" and a length time delay "$t_{DL}$".

$R_1$ and $R_2$ are resistances. The constants, parameters and variables of interest, as well as the equations that define and relate these quantities, along with the preferred units are given below:

"L" is the length of the plane (inches)
"W" is the width of the plane (inches)
"thk" is the thickness of the dielectric (mils)
"Cu" is the metalization thickness (mils)
"velc" is the speed of light in a vacuum (inches/sec)
"hertz" is the frequency variable
"$\epsilon_0$" is the vacuum dielectric constant (permittivity) (picofarads/inch)
"$\epsilon_r$" is the dielectric constant
"$\sigma$" is the copper conductivity (per ohm/mils)
"$\mu_0$" is the permeability of a vacuum (henries/mil)
"vel" is the velocity of a signal on the electrical interconnecting apparatus $$vel = velc/\sqrt{\sqrt{\epsilon_r}}$$

"n" is the size of the grid, i.e. 8 as shown
"asp" is the aspect ratio of the grid, asp=L/W
"factor" is a calibration factor to compensate for capacitive loading $$factor = 1/\sqrt{\sqrt{2}}$$

"$t_{FL}$" is the time of flight for the length dimension, $t_{FL}$=L/vel
"$t_{FW}$" is the time of flight for the width dimension, $t_{FW}$=W/vel
"$t_{DL}$" is the transmission line delay time for the length dimension $$t_{DL} = t_{FL}/(2n) factor$$

"$t_{DW}$" is the transmission line delay time for the width dimension $$t_{DW} = t_{FW}/(2n) factor$$

"cap" is the parallel plate capacitance of the plane $$cap = (\epsilon_0 \epsilon_r LW)/(10^{-9} thk)$$

"$Z_L$" is the impedance in the length direction $$Z_L = (n/cap)(t_{FL} + asp \cdot t_{FW}) factor$$

"$Z_W$" is the impedance in the width direction, $Z_W = Z_L/asp$
"$R_1$" is the smaller of:

$$R_{1A} = ((L/W)/2) \cdot (1/(\sigma \cdot (1/\sqrt{hertz \cdot \pi \mu_0 \sigma})))$$

$$R_{1B} = ((L/W)2) \cdot (1/(\sigma \cdot cu))$$

"$R_2$" is the smaller of:

$$R_{2A} = ((W/L)/2) \cdot (1/(\sigma \cdot (1/\sqrt{hertz \cdot \pi \mu_0 \sigma})))$$

$$R_{2B} = ((W/L)/2) \cdot (1/(\sigma \cdot cu))$$

The model represents an electrical interconnecting apparatus, which may be, for example, a printed circuit board (PCB), a semiconductor device package substrate, or an integrated circuit substrate. The method may include creating a model of the power distribution system based upon an M×N grid for both the power plane and the ground plane. The model may be based upon a fixed grid that adapts automatically to the actual physical dimensions of the electrical interconnecting apparatus. The model preferably also calculates the system response to chosen decoupling capacitors in both single node and M×N node versions.

The model may receive input from a user and from a database of various physical and/or electrical characteristics for a plurality of decoupling capacitors. Various characteristics of interest include physical dimensions, type and thickness of dielectric, method and materials of manufacture, capacitance, mounted inductance, and equivalent series resistance (ESR). The desired characteristics are may be saved in a database for corrections, additions, deletions, and updates.

In one embodiment, the model of the power distribution system may be in the form of a plane including two dimensional distributed transmission lines. The model of the power distribution system may comprise a plurality of the following: one or more physical dimensions of the power plane, one or more physical dimensions of the ground plane, physical separation distance of the power plane and the ground plane, composition of a dielectric separating the power plane and the ground plane, one or more active device characteristics, one or more power supply characteristics, and one or more of the decoupling capacitors. In a preferred embodiment, M and N have an equal value, 8 as shown. In various embodiments, the active components may act as current sources and/or sinks, and may include processors, memories, application specific integrated circuits (ASICs), or logic ICs. In one embodiment, a total sum of all values of the current sources in the model may be scaled to equal one ampere.

In one embodiment, the model of the power distribution system may be used for determining the decoupling capacitors for a frequency range above a lowest board resonance frequency. Additional information on board resonance frequencies is found later with respect to FIG. 5. In another embodiment, the model of the power distribution system may be used for determining the decoupling capacitors for a frequency range above a highest resonance frequency from all resonance frequencies of the decoupling capacitors.

In one embodiment, the model uses a weighting factor in determining a number of a particular decoupling capacitors to include in the model. The weighting factor is a dimensionless non-zero positive number. In the frequency range where EMI is most important, the preferred weighting factor is 0.2. The EMI frequency range is preferably above approximately 200 MHz. Preferably, the weighting factor is 1.0 in a frequency range where signal integrity is most important. The frequency range where signal integrity is important may be approximately 10 MHz up to approximately 200–300 MHz. The weighting factor is preferably 2.0 at all active device operating frequencies and harmonics of the active device operating frequencies. In one embodiment, the model may account for the affects of frequency dependent skin effect loss.

FIG. 4—Grid

Figure 4:
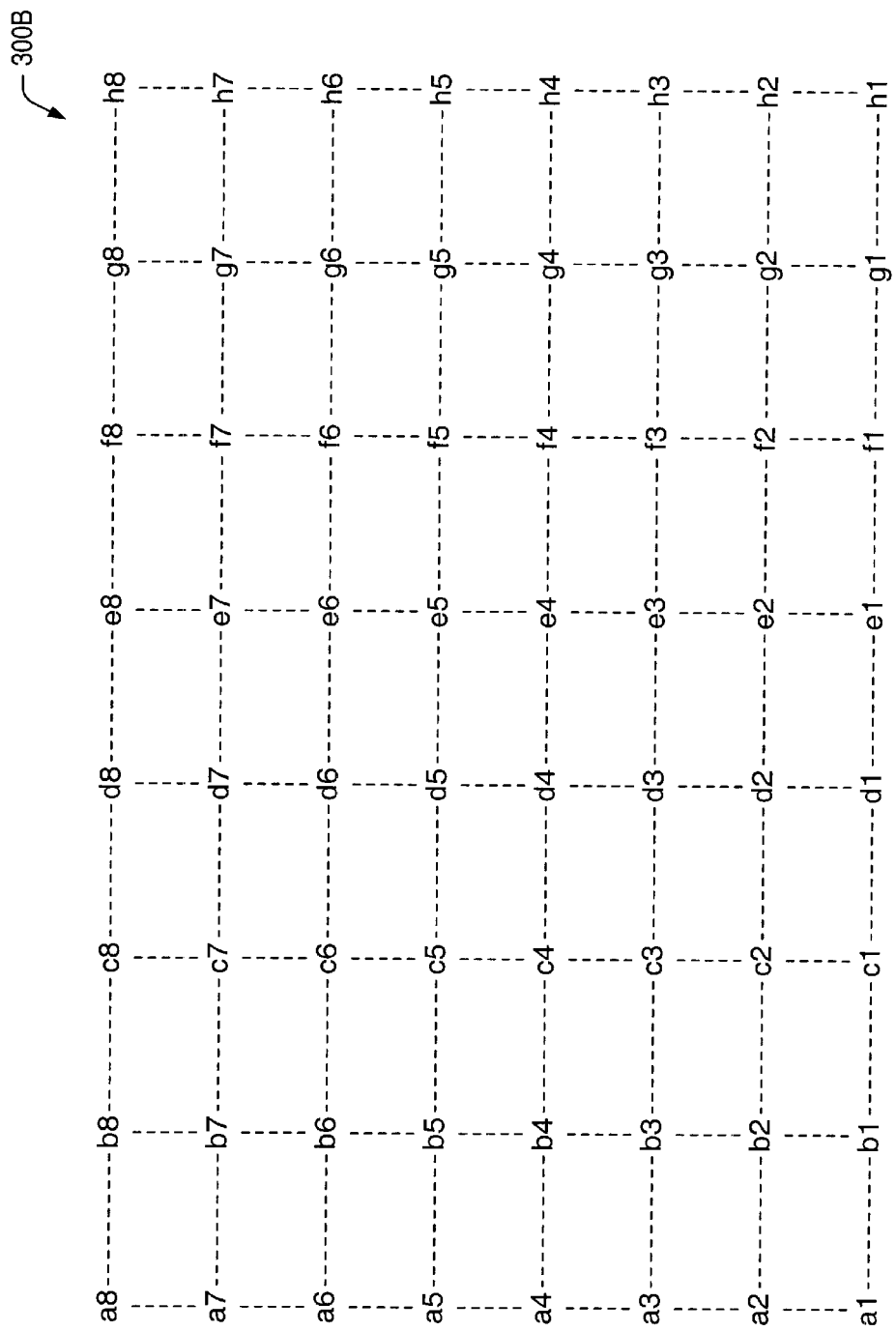
FIG. 4 is a representative grid of the nodal interconnections of the model of the power distribution system shown in FIG. 3A.

FIG. 4 illustrates the 8×8 grid 300B of nodes 370 that are used to model the power and ground planes with the respective designations of a1 through h8, in one embodiment. This grid 300B is used to determine the locations of the decoupling capacitors for the power distribution system.

Figure 5:
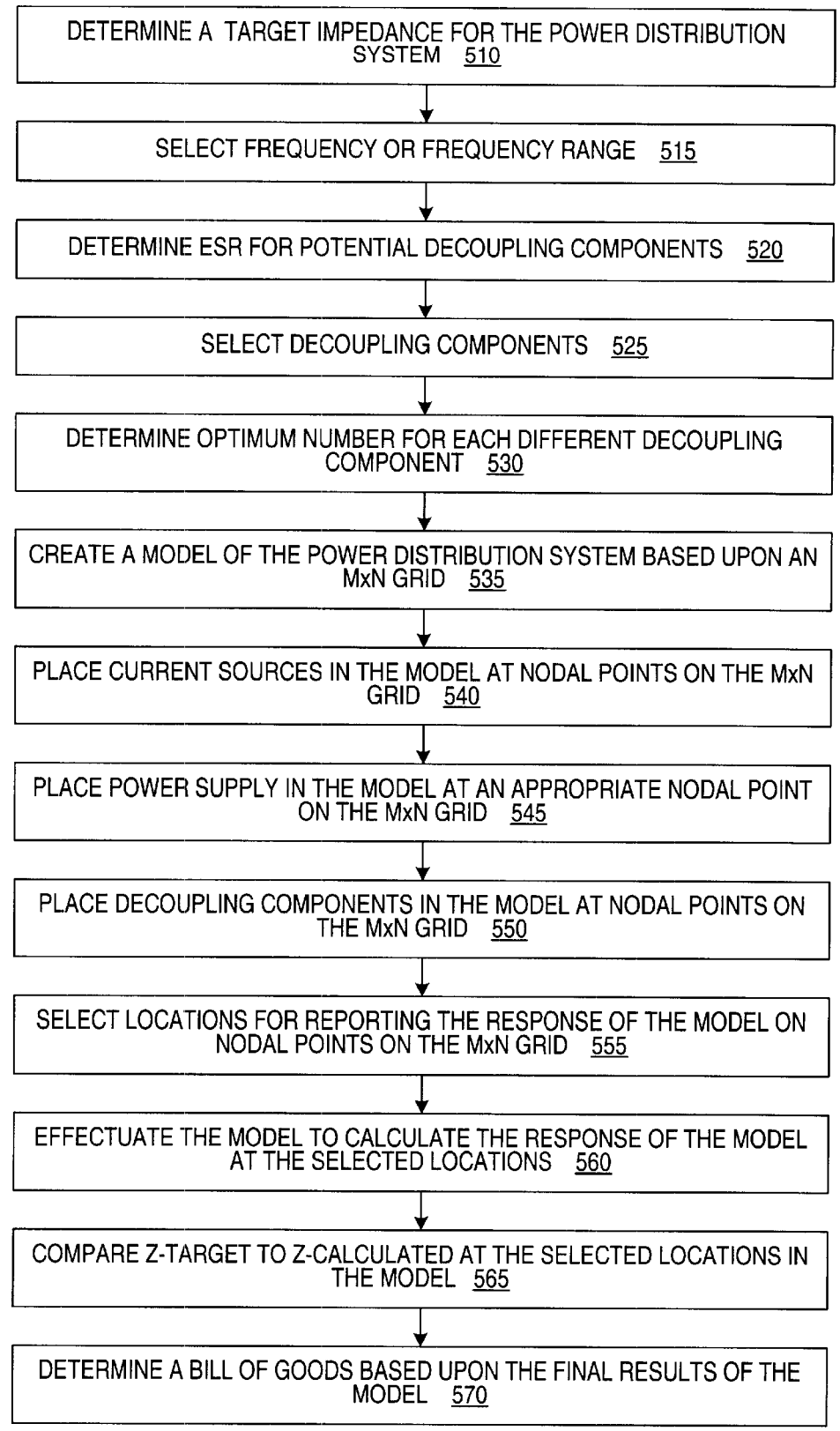
FIG. 5 is a flowchart of an embodiment of a method for determining decoupling capacitors for a power distribution system.

FIG. 5—Method for Determining Decoupling Capacitors

FIG. 5 illustrates a flowchart of an embodiment of a method for determining decoupling capacitors for an electronic circuit having a power distribution system. The method is shown as a straight through method with no loop-back. In other embodiments, the method includes feedback loops at various stages to change previous inputs. The method is not required to be, but may be, iterative. The method is may be performed in a top-down fashion.

The method determines a target impedance for the power distribution system 510. The target impedance is may be determined at a desired frequency or over a desired frequency range. The target impedance may be constant for all frequencies, or may be frequency dependent. The target impedance may be determined based upon such factors as power supply voltage, total current consumption, and allowable voltage ripple in the power distribution system. In one embodiment, a constant target impedance may be determined by the formula:

$$Z_T = (V_{PS} \times V_{RIPPLE})/I_T$$

wherein $Z_T$ is the target impedance, $V_{PS}$ is the power supply voltage, $V_{RIPPLE}$ is the allowable voltage ripple, and $I_T$ is the total current consumed by the electronic circuit for which the power distribution system supplies power.

In another embodiment, a frequency dependent target impedance may be determined for the power distribution system. The frequency dependent target impedance may vary with frequency. The variation of the target impedance may be small between 0 Hz and a corner frequency, while the variation may be more pronounced above the corner frequency. In one embodiment, the target impedance may rise slowly between a first frequency, such as 0 Hz, and the corner frequency, and rise rapidly for frequencies above the corner frequency. By allowing the target impedance to rise as frequency increases, fewer capacitors may be required to meet the target impedance for higher frequencies.

The calculation of the corner frequency may depend upon a frequency of a clock signal and a frequency component of the clock signal rise time. The frequency component of the clock signal rise time may be flat at lower frequencies, and may fall off at a rate of approximately 20 dB per decade beyond the corner frequency. The frequency component of the clock signal rise time may be determined using the following formula:

$$F_{eq} = 0.35/T_{RISE},$$

where $F_{eq}$ is known as the equivalent frequency (the frequency component of the clock signal rise time) and $T_{RISE}$ is the rise time of the clock signal. If $F_{eq}$ is of the same order of magnitude as the frequency of the clock signal, then $F_C = F_{eq}$, wherein $F_C$ is the corner frequency. If the equivalent frequency is of a higher order of magnitude than the frequency of the clock signal, than the corner frequency may be determined by the formula:

$$F_C = 0.125 \times F_{CLK},$$

Wherein $F_{CLK}$ is the frequency of the clock signal. Once the corner frequency has been determined, the target impedance may be calculated for any given frequency desired. Further details about the calculation of a frequency dependent target impedance will be discussed below with reference to FIG. 10.

In one embodiment, the total current may be normalized to one ampere. The target impedance may be comprised in a group of known system parameters. Other known system parameters may include one or more power supply characteristics, the allowable voltage ripple, the total current consumption of all devices in the electronic circuit, one or more physical dimensions of the power distribution system, physical location constraints on where devices may be placed in the power distribution system, and/or a frequency or frequency range of interest.

The method may select a frequency range of interest 515. The frequency range may start at dc and rise up to or above the gigahertz range. In one embodiment, the model of the power distribution system may be used for determining the decoupling capacitors for a frequency range above approximately a lowest board resonance frequency. In another embodiment, the model of the power distribution system may be used for determining the decoupling capacitors for a frequency range above a highest resonance frequency from all resonance frequencies of the decoupling capacitors. In embodiments where the target impedance is frequency dependent, the selected frequency range may include frequencies from 0 Hz up to the corner frequency and beyond. As mentioned above, the frequency range of interest may be comprised in the known system parameters. In one embodiment, the frequency range of interest determines the output of the method by limiting the frequency range over which the system impedance is calculated in the model.

The method may determine the ESR for the plurality of decoupling capacitors 520. The ESR is preferably included in the database of various physical and/or electrical characteristics for each of the plurality of decoupling capacitors. Various other characteristics of interest may include physical dimensions, type and thickness of dielectric, method and materials of manufacture, capacitance, and mounted inductance. The desired characteristics are preferably saved in the database for corrections, additions, deletions, and updates. Additional details concerning determining the ESR for the plurality of decoupling capacitors 520 is given below with respect to FIG. 6.

The method preferably selects one or more decoupling capacitors from a plurality of possible decoupling capacitors 525. Characteristics upon which the selection is made include capacitance, mounted inductance, and ESR. In one embodiment, a range of the values of the capacitors is chosen such that a superposition of impedance profiles provide an impedance at or below the target impedance for the power distribution system over the frequency range of interest. In another embodiment, the impedance profiles of the plurality of possible decoupling capacitors are compared to resonance frequencies for the power distribution system.

The decoupling capacitors have resonance frequencies, which should substantially correspond to the resonance frequencies of the power distribution system in the frequency range of interest. Resonance frequencies for the decoupling capacitors are preferably chosen to approximately correspond to board resonance frequencies, operating frequencies and harmonics of active devices, including power supply, on the electrical interconnecting apparatus, and interaction resonance frequencies, high frequency response frequencies from interactions of the various components in the power distribution system. In various embodiments, the capacitors are selected by the type of manufacture, such as the dielectric composition, or a physical or electrical characteristic value, such as the mounted inductance. The mounted inductance includes the geometry and physical coupling to the electrical interconnecting apparatus. The resonance frequency for a capacitor may be calculated from the mounted inductance and the capacitance using the following formula:

$$f_{resonance} = 1/(2\pi\sqrt{LC})$$

The impedance of the capacitor at the resonance frequency is the ESR. It is noted that ceramic capacitors often have a deep cusp at the resonance frequency. Tantalum capacitors often have a deep broad bottom with a variable slope as a function of frequency.

Once the desired decoupling capacitors have been selected, the optimum or desired quantity of each of the selected decoupling capacitors is determined by the method 530. In one embodiment, the number of each of the of the selected decoupling capacitors is determined by the method 530 in response to the method selecting the decoupling capacitors from a plurality of possible decoupling capacitors 525.

The method, therefore, preferably determines a number (i.e. a counting number, 1, 2, . . . ) for each of the one or more decoupling capacitors chosen to be included as part of the power distribution model 530. In other words, the method determines the quantity of each particular decoupling capacitor to include in the model. In one embodiment, the number of the various decoupling capacitors is chosen based upon the frequency range of interest and the impedance profiles of the plurality of possible decoupling capacitors. In another embodiment, the quantity of a particular decoupling capacitor may be determined using the formula $N=ESR/Z_T$, where N is the quantity of the selected decoupling capacitor, ESR is the equivalent series resistance of the selected decoupling capacitor, and $Z_T$ is the target impedance, which may be constant or frequency dependent. Since the quotient obtained by dividing ESR by target impedance may produce non-integer values, N may be rounded up to the next highest integer value to ensure that the impedance provided by the selected capacitors is less than or equal to the target impedance.

In still another embodiment, the quantity of a particular decoupling capacitors has approximately equal value of impedance to the target impedance for the power distribution system when the quantity of the particular decoupling capacitors are placed in parallel. In one embodiment, determining the quantity for the each of the decoupling capacitors 530 occurs before simulating operation of the model of the electronic circuit to determine the transfer impedance values as the function of frequency at the one or more specific locations 560. In another embodiment, the quantity of a selected decoupling capacitor has a value determined by the formula $N=ESR/Z_T$, as noted above. In still another embodiment, the quantity of decoupling capacitors is determined for all decoupling capacitors 530 in the plurality of possible decoupling capacitors (i.e. in the database described above) before selecting the decoupling capacitors to be used in the model 525. The calculations for selecting decoupling capacitors 525 and determining the number of each of the selected decoupling capacitors 530 may be performed by a computer system. Additional details will be discussed below with respect to FIGS. 7–9.

The method creates (i.e. realizes or implements) the model of the power distribution in 535 based on inputs from a user. The model may be that which is described above with respect to FIGS. 3A and 3B. The model may be a mathematical model suitable for use in a computer system, and may be a SPICE model. Additional details may be found elsewhere in this disclosure.

The method next populates the model of the power distribution system. That is, the method adds to the model representations of those devices that are coupled to the electrical interconnecting apparatus. The method places representations of current sources (or sinks) in the model at nodal points 370 on the M×N grid 300B in 540. The current source representations are placed in the model at one or more locations corresponding to one or more physical locations of active components. Examples of active components include processors, memories, application specific integrated circuits (ASICs), or logic integrated circuits (logic ICs). It is noted that active devices may act as current sources or sinks. The total value of the current sources is may be scaled to one ampere in order to simplify calculations. The numbers, current ratings and strengths, and locations of the current sources may be included in the known system parameters. The placing of current sources and/or sinks in the model of the electronic circuit may be based on such known system parameters.

Optionally, the method places representations for one or more power supplies in the model at nodal points 370 representing one or more physical locations on the electrical interconnecting apparatus 545. The power supply may be comprised in the model as one or more pole frequencies, one or more zero frequencies, and one or more resistances, and may further include voltage and current ratings. Preferably, one pole frequency, one zero frequency, and two resistances are used, along with the output voltage. Typically, the parameters are treated as a series with one resistance in parallel with the zero frequency. The parameters and locations of any power supplies are usually part of the known system parameters. In one embodiment, placing the power supply in the model is performed by the computer system. Additional details may be found with respect to FIGS. 8–9.

The method also preferably places representations of the decoupling capacitors in the model of the power distribution system at nodal points 370 that couple the M×N grid 300 for the power plane and the corresponding M×N grid for the ground plane 550. Particular decoupling capacitors should optimally be placed as close as possible to those device locations which have resonance frequencies in the frequency range of interest. Resonance frequencies for the power distribution system should be interpreted in this disclosure to include board resonance frequencies, operating frequencies and harmonics of active devices on the electrical interconnecting apparatus, and high frequency response frequencies from interactions of the various components in the power distribution system. High frequency response is often highly spatially dependent.

Board resonance frequencies are a function of the physical dimensions of the power distribution system and the dielectric constant of the dielectric that separates the power plane from the one or more ground planes. The board resonance frequencies of interest in a preferred embodiment include the half-, full-, three-half-, second-full-, and five-half-wave resonance frequencies for both the length and the width. The values for these board resonance frequencies are given by the appropriate multiples of vel, L, and W as defined earlier. For example, the half wave resonance for the length is (1/2)*vel*L. The three-half wave resonance for the width is (3/2)*vel*W.

To suppress the board resonance frequencies, decoupling capacitors are placed in the power distribution system at locations that provide a low impedance shunt for high impedance resonance nodes (i.e. high voltage standing wave points). By noting where the board resonance has one or more maximums, the placement follows at or near those corresponding locations. For a half wave resonance, the decoupling capacitors should be placed along the edges of the power distribution system or the electrical connecting apparatus. Since the apparatus is not one dimensional, the decoupling capacitors are placed on the line resulting from the intersection of the resonance and the plane defining the power distribution system. Therefore, the decoupling capacitors for the length half-wave resonance are preferably placed along the edges on the width of the power distribution system. For the full wave resonance, the decoupling capacitors are preferably placed along the edges and along the center axis of the power distribution system. For the three-half-wave resonance, the decoupling capacitors are preferably placed along the edges and at points one-third in from each edge. For the second-full-wave resonance, the decoupling capacitors are preferably placed along the edges, along the center axis, and at points one-fourth in from each edge. For the five-half-wave resonance, the decoupling capacitors are preferably placed along the edges, at points one-fifth in from each edge, and at points two-fifths in from each edge. It is noted that a square electrical connecting apparatus the lengthwise and widthwise resonances will be at the same frequencies and have maximums at corresponding locations. It is also noted that similar relations are found with respect to an electrical connecting apparatus having a different geometry, such as elliptical, etc.

Resonance or operating frequencies for the power supply are usually low enough that the capacitance can be treated as a lumped capacitance. Thus decoupling capacitors for the power supply may be placed anywhere on the electrical interconnecting apparatus. Physical limitations on locations must always be observed. This means that some decoupling capacitors will be placed farther away from the noise source than optimum. The method may yield an indication that additional decoupling capacitors selected for a particular noise source will need to be placed on the electrical interconnecting apparatus at the farther away location. In one embodiment, placement of decoupling capacitors 550 is input to the computerized model. Additional details may be found in the descriptions of FIGS. 8–9.

The method may select one or more specific locations in the model of the power distribution system to calculate transfer impedance values 555 as a function of frequency. The specific locations may include all 64 nodes on the 8×8 grid. To shorten execution time of the computer system, other numbers of nodes may be chosen. It is noted that as the number of nodes increases, the model may more accurately predict the board resonance frequencies up to higher frequencies. In one embodiment, the operation of the electronic circuit is simulated twice using its representative model, once with a single specific node with all components placed on the single specific node and then a second time with the power distribution system filling the entire 64 nodes of the model, or other quantity in the event that a larger or smaller number of nodes is chosen. The specific locations represented by the nodes are usually part of the known system parameters. It is noted that if fewer nodes are chosen, the usable bandwidth of the model will be lower.

The method preferably simulates operation of the electronic circuit using its representative model in order to determine the transfer impedance values as the function of frequency at the one or more specific locations previously chosen 560. In one embodiment, the electronic circuit is simulated using the model by running computer programs on the computer system. Additional details may be found in the description of FIGS. 8–9.

The method then preferably compares the transfer impedance values as the function of frequency at the one or more specific locations to the target impedance for the power distribution system 565. In one embodiment, one or more graphs are output which illustrates the transfer impedance values as a function of frequency. Preferably, the graphs are computer generated. In another embodiment, the method indicates a resultant noise level for the power distribution system due to the current sources and the decoupling capacitors at the specific locations. In still another embodiment, the method outputs the plurality of resultant impedances at the plurality of specific locations in the power distribution system dynamically as a function of frequency.

Preferably, the method determines at least a portion of a "bill of goods" for the power distribution system based upon the results of simulating the electronic circuit using the model in step 570. The bill of goods lists all relevant information from the selecting and placing of the various decoupling capacitors. The bill of goods is preferably sufficient to allow mass production of the electronic circuit modeled to occur with proper decoupling of the final product. Although the method is shown in flowchart form, it is noted that portions of FIG. 5 may occur concurrently or in different orders.

Figures 6, 7:
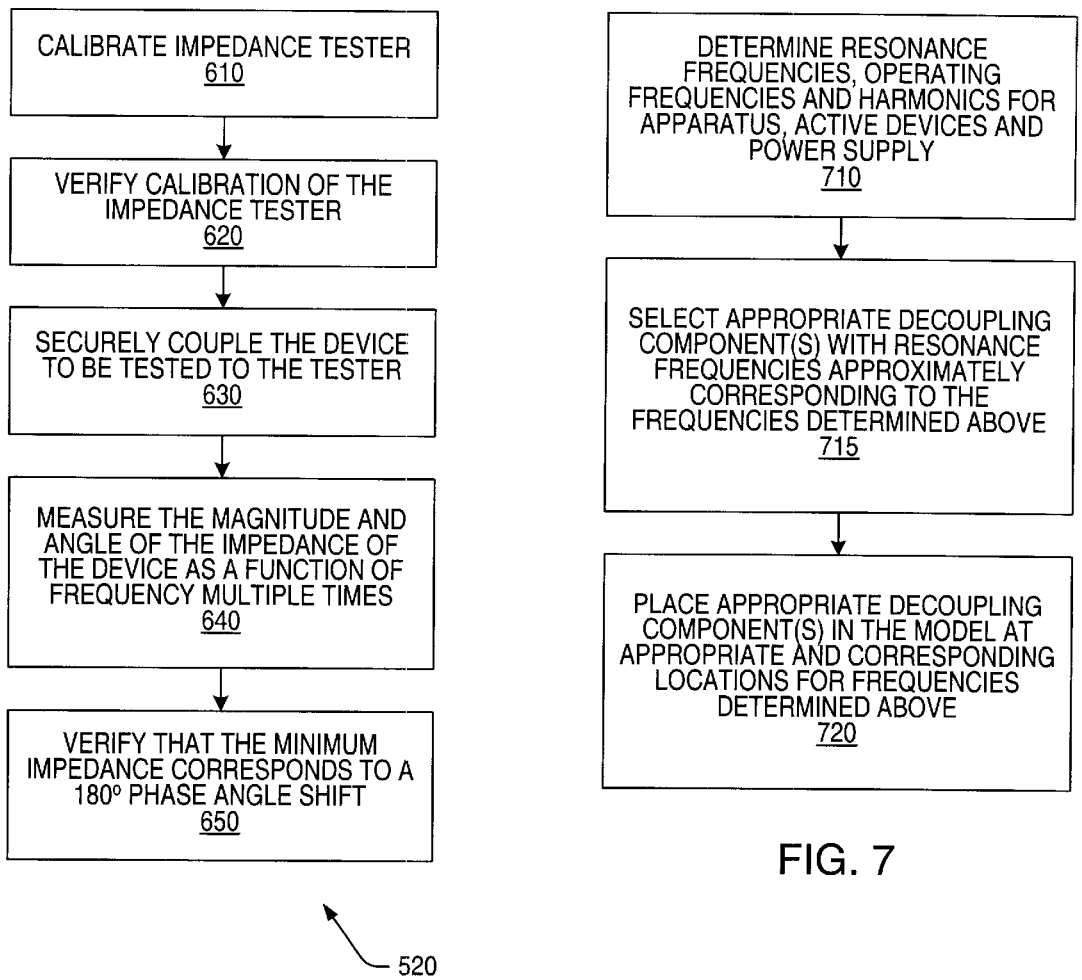
FIG. 6 is a flowchart of an embodiment of a method for measuring the equivalent series resistance of an electrical device.
FIG. 7 is a flowchart of an embodiment of a method for placing decoupling capacitors in a power distribution system.

FIG. 6—Method for Measuring ESR

FIG. 6 illustrates a flowchart of an embodiment of a method for measuring the ESR of an electrical device. The method comprises calibrating an impedance tester 610. Calibrating preferably comprises connecting the test heads to the impedance tester prior to all other work. In a one embodiment, the impedance tester may be a HEWLETT-PACKARD model 4291A RF Impedance/Material Analyzer. The test heads preferably comprise a low impedance test head, an APC7 connector for the test head, and an adapter to couple APC7 to an SMA connector. Calibrating preferably involves three test cases using a 50 Ω load, a short, and an open circuit.

The method verifies 620 the calibration performed in 610 before mounting the electrical device. Verification comprises comparing the expected Smith chart reflection coefficient for each test case with the experimentally determined reflection coefficient. After the impedance test passes the calibration, the device is securely coupled to the impedance tester 630. Preferably, securely coupling the device to the tester comprises soldering the device to an SMA connector by connecting one side of the device to the central post and the other side of the device to the outer connector. In another embodiment, securely coupling the device to the tester comprises mounting the device on the tester in such a fashion that stray capacitances and inductances are mostly eliminated. The SMA connector is then mounted to the impedance tester.

The method measures the impedance of the device as a function of frequency over the desired frequency range 640. In one embodiment, both the magnitude and the phase angle of the impedance are measured. Preferably, the measurement is repeated multiple times and the results averaged. The method then verifies the results of the measurements 650. Verification comprises comparing 180° to the phase angle shift at the frequency at which the device has a minimum measured impedance value. If the phase shift at the frequency at which the device has a minimum measured impedance value is not 180° at an acceptable uncertainty, then the results are discarded and the method performed anew. If the phase shift at the frequency at which the device has a minimum measured impedance value is 180° at an accepted uncertainty, then the ESR of the device is the magnitude of the impedance at the frequency at which the device has a minimum measured impedance value is 180°. Although the method is shown in flowchart form, it is noted that portions of FIG. 6 may occur concurrently or in different orders. Additional details may be found in co-pending U.S. patent application Ser. No. 09/149,164, filed on Sep. 8, 1998, hereby incorporated by reference in its entirety.

In one embodiment, measuring the impedance as a function of frequency is comprised as follows. Set the MAG ($|Z|$)

and ($\theta_Z$) from "Meas" under the dual parameter key on the HP 4291A. Choose frequency range from 1 MHz to 1.8 GHz under the sweep button menu. Choose sweep type as logarithmic. Choose Marker search under search button and set it to minimum. Set marker search to on. Click on "Bw/Avg" menu under measurement block. Choose Sweep average and set average factor to 20. Hit sweep average start button to start taking measurements as a function of frequency. Note the minimum value after the averaging counter reaches 20. Repeat steps for each device.

FIG. 7—Method for Selecting and Placing Decoupling Capacitors

FIG. 7 illustrates a flowchart of an embodiment of a method for selecting decoupling capacitors and placing the decoupling capacitors in a power distribution system of an electronic circuit. The method first determines resonance frequencies for the electrical interconnection apparatus, the active devices, and the power supply 710. Note that "resonance frequency" includes the operating frequencies and harmonics of the active devices and the power supply. Integer fractions of these frequencies may also be considered as resonance frequencies. The resonance frequencies of the electrical interconnection apparatus are also described as board resonance frequencies or board frequencies. The method then selects appropriate decoupling capacitors 715. Appropriate decoupling capacitors may have resonance frequencies that correspond approximately to the system resonance frequencies determined in 710. The method next places the representations of the selected decoupling capacitors in the model at appropriate and corresponding locations for the system resonance frequencies 720. After the model calculations are completed, the appropriate decoupling capacitors will be placed on the electrical interconnection apparatus.

In various embodiments, the electrical interconnection apparatus may have one or more board resonance frequencies, with each of the board resonance frequencies corresponding to one or more particular dimensions of the electrical interconnection apparatus. Placement of a decoupling capacitor 720 corresponding to a particular board resonance frequency is may be at a location corresponding to the particular dimension in question.

In one embodiment, the method selects first decoupling capacitors corresponding to the board resonance frequencies 715. In another embodiment, the method selects second decoupling capacitors corresponding to the active device operating frequencies 715. In still another embodiment, the method selects third decoupling capacitors corresponding to one or more harmonics of the active device operating frequencies 715. The method may also select additional decoupling capacitors corresponding to additional board resonance frequencies, active device operating frequencies or harmonics, or interaction resonance frequencies 715.

In an embodiment where the electrical interconnection device has approximately a rectangular shape, the first dimension corresponds to an effective length and the second dimension corresponds to an effective width. The preferred locations for placing decoupling capacitors corresponding to the board resonance frequencies for the first and second dimensions include the edges along the length and the width. A preferred location along the dimension includes the midpoint of the dimension.

In one embodiment, selecting appropriate decoupling capacitors with resonance frequencies approximately corresponding to the resonance frequencies of the power distribution system 715 includes selecting the quantity of each of the decoupling capacitors. The quantity of each of the decoupling capacitors is chosen in one embodiment based upon the frequency range of interest and the impedance profiles of the plurality of possible decoupling capacitors. In another embodiment, the quantities are chosen by a computer system. The computer system may access a database of values on the plurality possible decoupling capacitors, including values for physical and/or electrical characteristics. Electrical characteristics included in the database may include rated capacitance, equivalent series resistance, and/or mounted inductance.

In another embodiment, the method for selecting decoupling capacitors and placing the decoupling capacitors in the model further comprises simulating the operation of the electronic circuit using the model and determining the system impedance response at one or more selected locations. If the system impedance response at the one or more selected locations is above a target impedance, the method selects additional decoupling capacitors in the proper frequency range. The method places the additional decoupling capacitors in the model in accordance available physical locations in the electronic circuit. The available locations may be constrained due to existing devices on the electrical interconnection apparatus, including other decoupling capacitors.

In still another embodiment, the method may include comparing an impedance of each particular one of the decoupling capacitors chosen by the method to the target impedance. The method may further select a quantity of each particular decoupling capacitor to provide a total impedance at or below the target impedance as a part of selecting appropriate decoupling capacitors 715. In yet another embodiment, the method selects decoupling capacitors above the lowest board resonance frequency. In another embodiment, the method also selects decoupling capacitors above a highest resonance frequency of the decoupling capacitors. Additional details on selecting particular decoupling capacitors and the number of each particular one of the decoupling capacitors may be found elsewhere in this disclosure. Although the method is shown in flowchart form, it is noted that portions of FIG. 7 may occur concurrently or in different orders.

FIG. 8—Computer System and Method for Selecting Decoupling capacitors

Figure 8A:
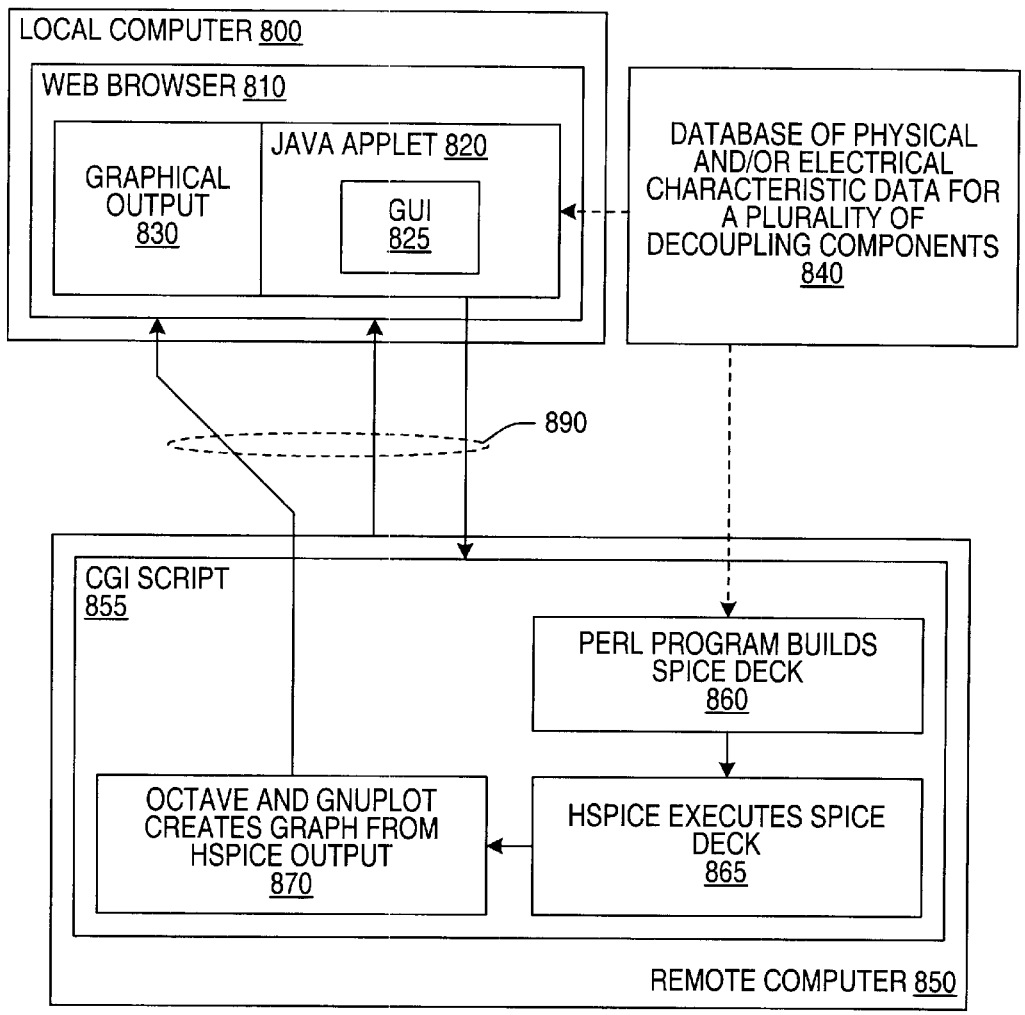
FIG. 8A is a block diagram of an embodiment of a computer system operable to implement the methods of determining the decoupling capacitors for a power distribution system.

FIG. 8A illustrates a block diagram of an embodiment of a computer system for selecting decoupling capacitors. As shown, the computer system includes a local computer 800 and a remote computer 850 coupled by a networking connection 890. An alternate embodiment may employ only a single computer. In one embodiment, the local computer 800 and the remote computer 850 are unified as a single computer, where the networking connection 890 comprises a bus in the single computer. Both the local computer 800 and the remote computer 850 are operable to accept input from a database of physical and/or electrical characteristic data for a plurality of decoupling capacitors 840. In various embodiments, the database may be comprised in the local computer 800 or in remote computer 850. In one embodiment, the database is comprised in remote computer 850 and accessible to the local computer 800 through the networking connection 890. In another embodiment, the database 840 is comprised external to both the local computer 800 and the remote computer 850, such as on a database computer.

As shown, the local computer 800 is operable execute a first program, preferably a web browser 810. The web browser 810 is operable to run an interactive applet 820, preferably a JAVA applet, and to accept and display graphical output 830. Alternative embodiments may comprise a JavaScript program or HTML code. The JAVA applet 820 outputs component and placement data using the http POST method to the remote computer. The CGI script 855 receives the component and placement data and either includes or calls a PERL program to build a SPICE deck 860. In other embodiments, CORBA, remote method invocation (RMI), or other methods may be used. The SPICE deck output of the PERL program 860 is sent to a simultaneous-equation-solver program, preferably a SPICE simulator such as HSPICE (available from Avant! Corporation, Fremont, Calif.), which executes the SPICE deck 865. The HSPICE output is preferably converted by OCTAVE and GNUPlot into a graph 870. The graph from 870 is preferably sent from the remote computer 850 to the local computer 800 to be displayed as graphic output 830 in the web browser 810. The actions of the CGI script 855 may also be performed by a second program. In one embodiment, the second program comprises the simultaneous-equation-solver program. In another embodiment, the simultaneous equation solver program comprises a circuit-solver program. Other embodiments of the second programs are also contemplated, including custom hardware or software. Furthermore, embodiments utilizing a single computer to perform the method are possible and contemplated. Such a singe computer may include a processor and a computer-readable medium for storing software instructions which execute the method. The computer readable medium may be one of a plurality of possible storage mediums which include, but are not limited to, DRAM, SRAM, hard disk storage, flash memory, CD-ROM, and DVD. In addition to a standard desktop computer, the single computer may be one of several different devices which include, but is not limited to, a laptop computer, programmable calculators, personal digital assistants, and so forth.

Figure 8B:
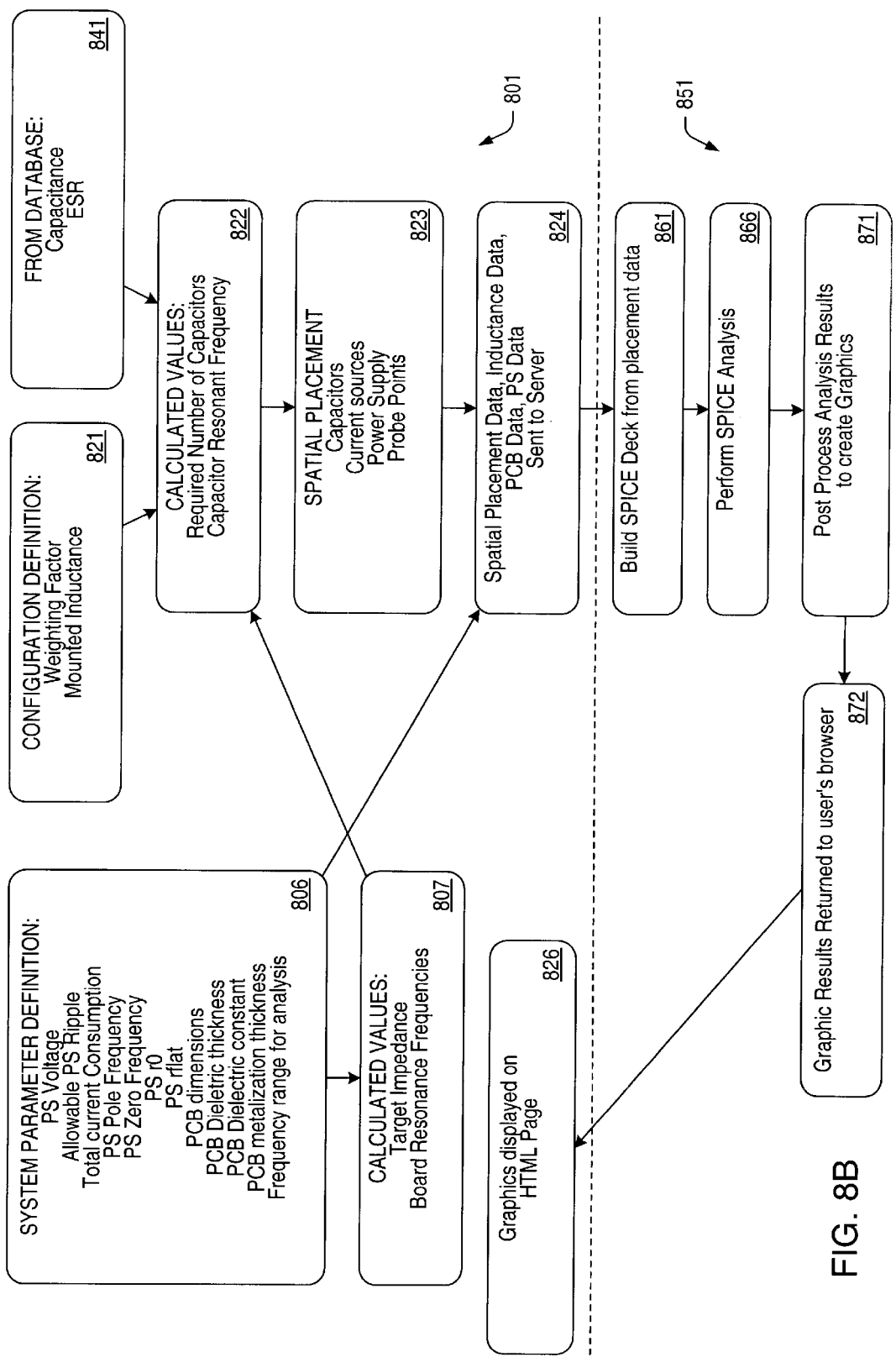
FIG. 8B is a flowchart of an embodiment of the method for determining decoupling capacitors for a power distribution system using the computer system of FIG. 8A.

FIG. 8B illustrates a flowchart of an embodiment of a method for determining decoupling capacitors for a power distribution system, preferably using the computer system of FIG. 8A. Actions 801 (above the line) may take place on the local computer 800, while actions 851 (below the line) preferably take place on the remote computer 850. In one embodiment, the actions 801 and 851 all take place in a single computer system. In another embodiment, the actions 801 and 851 take place outside the computer system. Systems parameters may be defined in 806. Preferably, the system parameters include power supply voltage, allowable power supply ripple, total current consumption, frequencies of the poles and zeros of the power supply, first and second power supply resistances, physical dimensions of the electrical interconnection device, dielectric thickness and constant, metalization thickness of the electrical interconnection device, and the frequency range of interest.

The system parameters defined in 806 are used to calculate values for the target impedance and one or more board resonance frequencies 807. Configuration parameters are defined in 821. The integration parameters preferably include weighting factors and mounted inductances for the plurality of decoupling capacitors. For purposes of this disclosure, mounted inductance refers to a loop inductance based on the geometry of the decoupling capacitors, pad geometry, distance to the power planes, and the location on the power planes. Values are extracted from the database of various physical and/or electrical characteristics for a plurality of decoupling capacitors 841. As shown, the database preferably includes the capacitance and ESR for the plurality of possible decoupling capacitors.

The calculated values 807, the configuration definitions 821, and the database values 841 are input to calculate the decoupling component resonance frequencies, and the optimum quantity of each chosen decoupling component 822. In one embodiment, the optimum quantity of each chosen decoupling component chosen for given frequency is the ESR of the decoupling component divided by the target impedance (ESR/$Z_T$) multiplied by the weighting factor. The decoupling capacitor frequencies (e.g. resonance frequencies) are preferably calculated using the equation given above.

Location of physical placement for each of the selected decoupling capacitors, current sources, power supply, and selected locations or probe points are chosen in 823, preferably by a user. Further details on placing the decoupling capacitors in the model of the power distribution system are given elsewhere in this disclosure. Physical placement data 823 and system parameter definitions 806 are combined into physical placement data, inductance data, electric interconnection device data, and power supply data 824 to be sent to the remote computer 850.

The data that were sent to the remote computer 824 are used to build a SPICE deck 861. The SPICE deck is used as input for a SPICE analysis 866, in one embodiment using HSPICE. Output from the SPICE analysis 866 is processed to create graphical output 871. The graph the output returned to the local computer 872, preferably to the web browser 810. The graphic display is preferably displayed on the local computer 826, preferably as an HTML page in the web browser 810. In one embodiment, the HTML page comprises an SGML page, or other program as desired. Although the method is shown in flowchart form, it is noted that portions of FIG. 8B may occur concurrently or in different orders.

Figure 9:
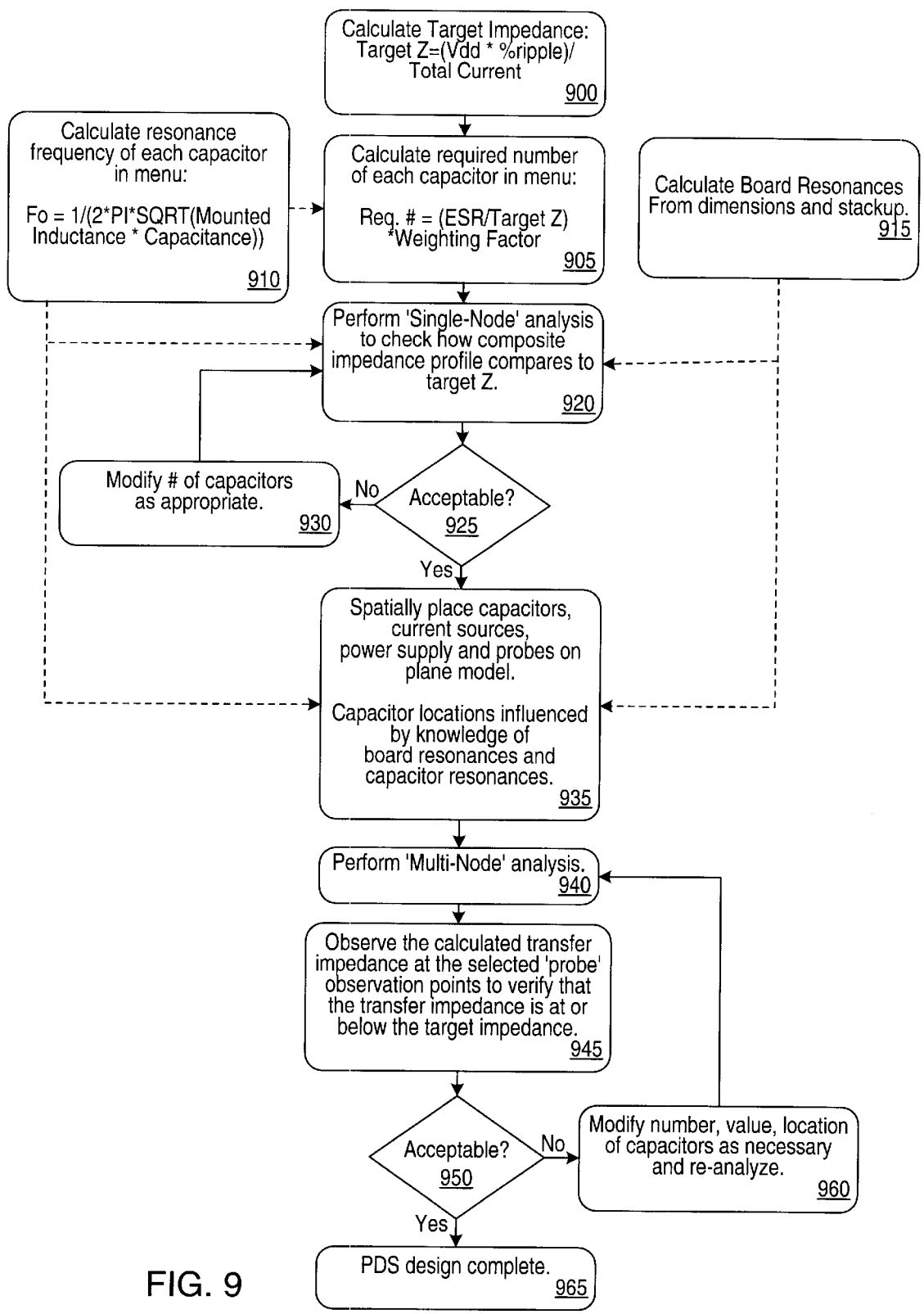
FIG. 9 is a flowchart of another embodiment of the method for determining decoupling capacitors for a power distribution system using the computer system of FIG. 8A.

FIG. 9—Another Embodiment of the Computerized Method

FIG. 9 illustrates a flowchart of an embodiment of a computerized method for determining the decoupling capacitors for a power distribution system. As shown, the method calculates the target impedance for the power distribution system 900. The target impedance is preferably calculated as a power supply voltage times the allowable power supply ripple divided by the total current ($Z_T$=($V_{PS}$×$V_{RIPPLE}$)/$I_T$). In one embodiment, the total current is normalized to one ampere. The calculated target impedance is used to calculate an optimum number of each available decoupling component 905. The optimum number is preferably defined as the ESR of the decoupling component divided by the target impedance (ESR/$Z_T$) multiplied by the weighting factor. The method also calculates the resonance frequency of each available decoupling component 910. The resonance frequency is may be calculated by the formula 1/SQRT($2\pi LC$), where L is the mounted inductance of the decoupling capacitor and C is its rated capacitance. The method also calculates board resonance frequencies 915, preferably based upon the dimensions of the electrical interconnection device and stackup on the electrical interconnection device.

Figure 2:
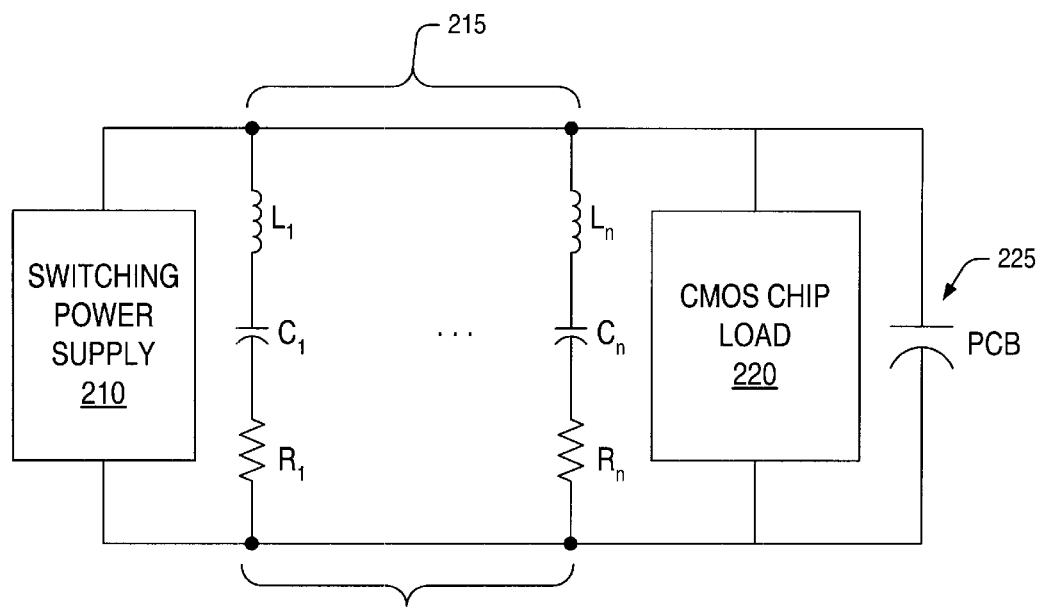
FIG. 2 is an embodiment of a prior art single node model of a power distribution system.

The method may perform a single node analysis to compare the composite impedance profile of the electrical interconnection device, including decoupling capacitors, to target impedance. In single node analysis, physical locations are not taken into account, as in the model illustrated in FIG. 2. The method next compares the results of the single node analysis to the target impedance 925 to determine if the composite impedance profile of the electrical interconnection device is acceptable. Acceptable is preferably defined as the target composite impedance profile being at or below the target impedance. If the composite impedance profile of the electrical interconnection device is not acceptable, the method varies one or more of the input parameters 930 and again performs single node analysis 920.

If the composite impedance profile of the electrical interconnection device after single node analysis is acceptable 925, then the method proceeds to spatially place the decoupling capacitors, the current sources, the power supply, and the specific probe locations in the model 935. The locations chosen for devices placed in the model are preferably influenced by the board resonance frequencies 910 and the capacitor resonance frequencies 915. Additional details on placing decoupling opponents for the power distribution system are given elsewhere in this disclosure.

The method next performs multi-node analysis 940. In a preferred embodiment, multi-node analysis corresponds to performing HSPICE analysis 866. The results of the multi-node analysis are observed 945. If the results are acceptable in 950, the power distribution design is considered complete 965. The preferred criteria for accepting the results of the multi-node analysis are that the system transfer impedance is below the target impedance over the frequency range of interest. Should results not be acceptable in 950, method modifies the choice of the decoupling capacitors, the number of each the decoupling opponents, and/or placement of the decoupling capacitors 960 and reanalyzes the model using multi-node analysis 940. Although the method is shown in flowchart form, it is noted that portions of FIG. 9 may occur concurrently or in different orders.

Figure 10:
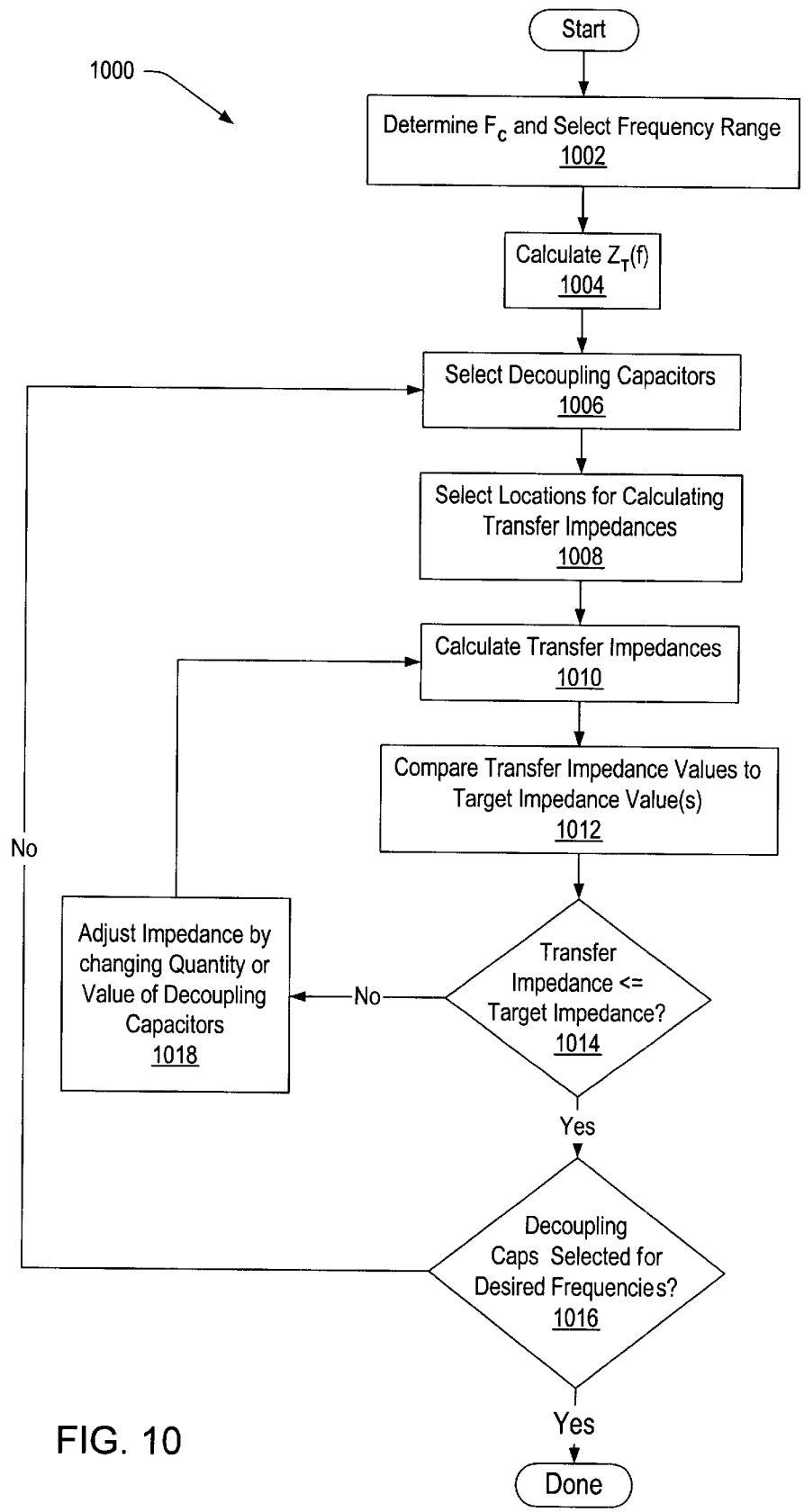
FIG. 10 is a flow diagram of one embodiment of a method for determining the required decoupling capacitors for a power distribution system having a frequency dependent target impedance.

FIG. 10—Flow Diagram of an Embodiment for Selecting Decoupling Capacitors based on a Frequency Dependent Target Impedance FIG. 10 is a flow diagram of one embodiment for selecting decoupling capacitors based on a frequency dependent target impedance. Method 1000 may be used to select decoupling capacitors for the power distribution system of an electronic circuit when the target impedance is assumed to be a function of frequency. By assuming a frequency dependent target impedance, the required quantity of decoupling capacitors may be reduced, particularly for frequencies with a higher target impedance. In one embodiment, the frequency range of interest for determining the decoupling capacitors may include frequencies from 0 Hz to a corner frequency, as well as frequencies above the corner frequency. Details on calculating the corner frequency are discussed above in reference to FIG. 5.

Method 1000 begins with step 1002, the calculation of the corner frequency and the selection of a frequency range of interest. In one embodiment, the frequency range of interest may include all frequencies from a first frequency, such as 0 Hz, to the calculated corner frequency. Frequencies above the corner frequency may be included if necessary. The frequency range of interest may be chosen based on various criteria, including resonance frequencies of the electrical interconnecting apparatus, pole and zero frequencies of the power supply and/or various other components, operational frequencies of various active components in the electronic circuit, harmonics produced by resonance or operational frequencies, and so on. In general, the frequency range may be chosen to cover all frequencies produced by or occurring in the electronic circuit, thereby allowing the selected decoupling capacitors to suppress or bypass those frequencies which may otherwise have an adverse effect on power distribution.

Once the corner frequency has been determined, the target impedance may be calculated, as is performed in step 1004. The target impedance may be calculated for any frequency using the formula:

$$Z_T(f) = Z_{DC} * [1 + (f/F_C)],$$

where $Z_T(f)$ is the target impedance as a function of frequency, $Z_{DC}$ is the target impedance at 0 Hz (sometimes referred to as the beginning impedance), and $F_C$ is the corner frequency. Other formulas for calculating a frequency dependent target impedance are possible and contemplated. Inspection of this formula reveals that the target impedance will rise slowly between 0 Hz and the corner frequency, as the $(f/F_C)$ term will have a value less than 1 for frequencies below the corner frequency. A correction factor may be applied to the beginning impedance to ensure that the impedance is rising throughout the chosen frequency range. The value of this term becomes 1 at the corner frequency, and will then rise rapidly for frequencies above the corner frequency. Because the target impedance may rise as frequency increases, fewer capacitors may be required for higher frequencies, as the quantity of capacitors required for a given frequency may be expressed by the formula:

$$N = ESR/Z_T(f),$$

where N is the quantity of selected capacitors for the given frequency, ESR is the equivalent series resistance of one of the selected capacitors, and $Z_T(f)$ is the target impedance at the given frequency. Since the formula may produce a non-integer value of N, it may be required to round N up to the next highest integer value in order ensure the quantity of capacitors meets the target impedance for the given frequency.

In step 1006, decoupling capacitors may be selected. The selection of decoupling capacitors may be based on several factors, including capacitance, mounted inductance, and equivalent series resistance. Other criteria, such as physical dimensions of the capacitors and the physical location of other components in the electronic circuit may be considered as well (as will be discussed below). In embodiments employing a mathematical model, such as a SPICE model, the model may be updated to include the parameters and effects of the selected decoupling capacitors.

In one embodiment, the resonance frequency of the capacitors (i.e. the frequencies at which ESR occurs) is given special consideration in selecting the decoupling capacitors. The capacitors may be chosen such that their resonance frequency matches a resonance frequency of the electronic circuit (such as those that occur in the electrical interconnecting apparatus). Aligning the resonance frequency of a capacitor with a resonance frequency of the circuit may allow for the most efficient elimination of noise that may occur in the power distribution system.

In step 1008, locations are selected for calculating transfer impedance values that occur in the electronic circuit. The chosen locations may correspond to actual physical locations within the electronic circuit. The locations may be selected based on physical constraints, including the location and physical dimensions of other components within the electronic circuit. Locations may also be selected based on factors such as operating frequencies of various circuit components. For example, decoupling capacitors may be placed near an active component with a high operating frequency in order to bypass any high frequency noise generated by the device. More information about the physical placement of capacitors in the power distribution system, and hence the selection of locations for calculating transfer impedances, can be found above in reference to FIG. 5.

In step 1010, the transfer impedance values may be calculated at the locations selected in step 1008. In one embodiment, the calculation of the transfer impedance is performed during or following a simulation of the operation of the electronic circuit. Simulating the operation of the electronic circuit may include simulating the switching of the drivers of each active component in the system in order to determine the effect of noise in the circuit. Simulating the electronic circuit may also be useful for determining the presence of any unexpected system noise which may necessitate additional decoupling capacitors. Transfer impedance values may be calculated for each capacitor or group of capacitors within the circuit. Since impedance is a frequency-dependent quantity, the transfer impedance values may be calculated for different frequencies. These frequencies may include the various resonance frequencies of the electronic circuit, operating frequencies of active components, harmonics of various frequencies, and clock signal frequencies.

Comparison of the calculated transfer impedance values to the calculated target impedance occurs in step 1012. The transfer impedance values may be compared to the target impedance for each frequency at which these values were determined. Additionally, results of the simulation may be examined to determine the presence of any unexpected or unaccounted for noise in the power distribution system. If unexpected noise is present in the system, additional decoupling capacitors may be required to suppress or bypass the noise. If no unexpected noise is present, comparison may be performed for those frequencies at which transfer impedance values were calculated. The comparison may be used to determine whether the calculated values of transfer impedance are less than or equal to the target impedance value for those frequencies at which calculations were performed (step 1014). If all of the calculated transfer impedance values are less than or equal to the target impedance, a determination may then be made as to whether there are additional frequencies for which decoupling capacitors may be required (step 1016). If no additional decoupling capacitors are required, then the method may then be brought to a conclusion. If additional decoupling is required, the method may select capacitors for those frequencies at which the additional capacitors are required. The method may then be repeated from that step in order to ensure that the additional decoupling capacitors are at or below the target impedance.

If, in step 1014, any calculated transfer impedance values are greater than the target impedance value for a particular frequency, the impedance may need to be adjusted (step 1018). The impedance for a given frequency may be adjusted by either changing the quantity of the selected decoupling capacitors for the particular frequency, or re-selecting decoupling capacitors with different capacitance values. It should be noted that, if different decoupling capacitors are selected at this step, they should have approximately the same resonance frequency as the previously selected capacitors. In such cases, the quality factor of a capacitor may become a determining factor as to whether new capacitors are selected. The quality factor may be used to determine the bandwidth over which the ESR of the capacitor is effective. This bandwidth may be found using the formula $BW=F_{RES}/Q$, where BW is the bandwidth, $F_{RES}$ is the frequency at which resonance occurs, and Q is the quality factor. When Q<<1, the bandwidth at which the impedance of the capacitor is at or near ESR is relatively wide. If Q>>1, the bandwidth is relatively narrow. These factors may be considered in determining whether to adjust the impedance value by changing the quantity of capacitors for a particular frequency, or selecting different capacitors.

Figure 11:
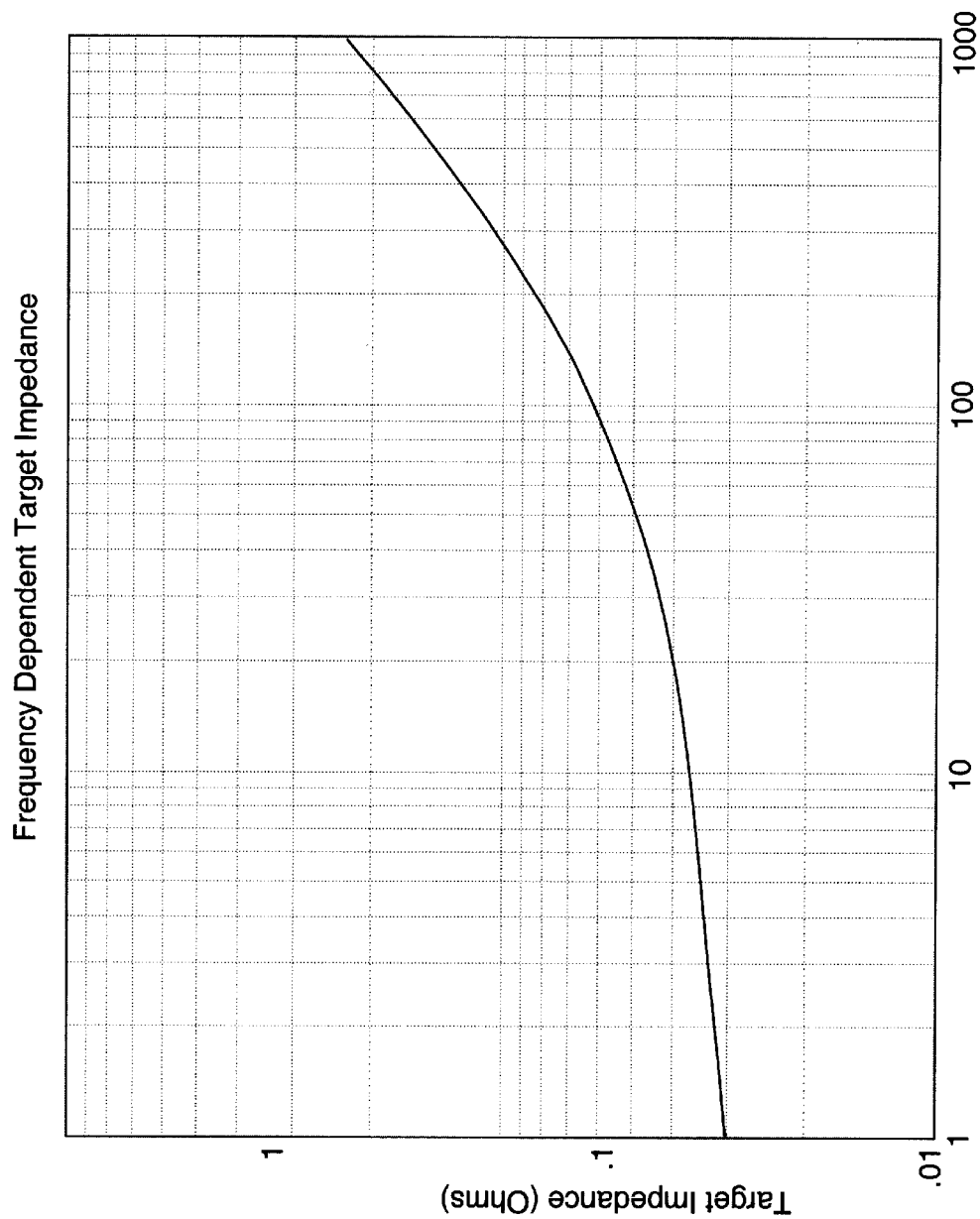
FIG. 11 is a graph of target impedance vs. frequency for one embodiment of a power distribution, wherein the corner frequency is 150 MHz.

FIG. 11—A Plot of Target Impedance vs. Frequency

FIG. 11 is a graph of target impedance vs. frequency for one embodiment of a power distribution, wherein the corner frequency is 150 MHz. In this particular example, the beginning impedance, $Z_{DC}$, is assumed to be 0.03 ohms. The plot of target impedance vs. frequency is presented here as a decade plot. Looking at the graph, one can see that the target impedance rises slowly below the corner frequency. The target impedance at 0 Hz, as previously stated, is 0.03 ohms, while the impedance at a frequency of 10 MHz is only 0.032 ohms. At 100 MHz, a full order of magnitude above 10 MHz, the calculated target impedance is 0.05 ohms. At the corner frequency, the target impedance is 0.06 ohms, and begins to rise rapidly as frequency increases. At 200 MHz, the target impedance is 0.07 ohms, and at 500 MHz, the target impedance is 0.13 ohms.

The increase in the target impedance, particularly the rapid increase above the corner frequency, may advantageously allow for fewer decoupling capacitors in the electronic circuit. Since impedance is inversely proportional to both frequency and capacitance, fewer capacitors may be required to meet the required target impedance when the target impedance is assumed to be a function of frequency. This may be particularly true at higher frequencies, in contrast to embodiments where the target impedance is assumed to be constant over the entire frequency range of interest.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for determining the required decoupling capacitors for decoupling a power distribution system, said determining performed for a frequency range including a first frequency up to a corner frequency, the method comprising:

selecting a specific quantity of decoupling capacitors based upon electrical characteristics of said decoupling capacitors;

calculating a total impedance provided by said decoupling capacitors at a given frequency;

comparing the total impedance to a target impedance at said given frequency;

adjusting said total impedance so that the total impedance at the given frequency is less than or equal to a target impedance, wherein said target impedance varies as a function of frequency; and performing said selecting, said calculating, said comparing, and said adjusting for one or more frequencies within said frequency range.

2. The method as recited in claim 1 further comprising determining a beginning impedance, wherein said beginning impedance is determined for a frequency of 0 Hz.

3. The method as recited in claim 2, wherein said target impedance is determined by the formula $Z_T(f)=Z_{DC}*[1+(f/F_C)]$, wherein $Z_T(f)$ is the target impedance, f is the frequency, $F_C$ is the corner frequency, and $Z_{DC}$ is the beginning impedance.

4. The method as recited in claim 3, wherein an equivalent frequency is calculated by the formula $F_{EQ}=0.35/T_{RISE}$, wherein $F_{EQ}$ is the equivalent frequency, $T_{RISE}$ is a rise time for a clock signal, and wherein $F_{EQ}$ defines the frequency content of said rise time for said clock signal.

5. The method as recited in claim 4, wherein said corner frequency is equal to said equivalent frequency when said equivalent frequency and the frequency of said clock signal are of the same order of magnitude.

6. The method as recited in claim 4, wherein said corner frequency is calculated by the formula $F_C=0.125*F_{CLK}$ when said equivalent frequency is of a different order of magnitude than the frequency of said clock signal wherein $F_C$ is the corner frequency and $F_{CLK}$ is the frequency of the clock signal.

7. The method as recited in claim 3, wherein said specific quantity of capacitors for a particular frequency is chosen based on the formula $N=ESR/Z_T(f)$, wherein N is the specific quantity of capacitors for said particular frequency, ESR is the equivalent series resistance for one of said specific quantity of capacitors, $Z_T(f)$ is the target impedance for said particular frequency, where f is the particular frequency.

8. The method as recited in claim 7, wherein N is rounded up to the next highest integer value.

9. The method as recited in claim 1, wherein said electrical characteristics include a rated capacitance value, a mounted inductance value, and an equivalent series resistance for each of said decoupling capacitors.

10. The method as recited in claim 9, wherein said mounted inductance value provides an indication of a resonance frequency for a particular decoupling capacitor.

11. A method for determining the desired decoupling capacitors for a power distribution system, the method comprising:
    inputting a model of an electronic circuit into a computer system, said electronic circuit having a power distribution system;
    selecting a frequency range for determining target impedance of the electronic circuit, wherein said frequency range includes frequencies from a first frequency up to a corner frequency;
    the computer system selecting decoupling capacitors for said electronic circuit from a database, said selecting based on electrical characteristics of said decoupling capacitors, and wherein said database includes information for a plurality of decoupling capacitors, wherein each of said plurality of decoupling capacitors has unique electrical characteristics;
    the computer system selecting one or more specific locations in said electronic circuit for calculating transfer impedance values based on said model of said electronic circuit, wherein said transfer impedance values are a function of frequency, and wherein said one or more specific locations correspond to physical locations of decoupling capacitors in said electronic circuit;
    the computer system simulating operation of said electronic circuit based on said model of said electronic circuit in order to determine the transfer impedance values at said one or more specific locations; and
    comparing the transfer impedance values resulting from said simulating to the target impedance in order to verify that the transfer impedance values are less than or equal to the target impedance, wherein the target impedance varies as a function of frequency.

12. The method as recited in claim 11 further comprising determining a beginning impedance, wherein said beginning impedance is determined for a frequency of 0 Hz.

13. The method as recited in claim 12, wherein said target impedance is determined by the formula $Z_T(f)=Z_{DC}*[1+(f/F_C)]$, wherein $Z_T(f)$ is the target impedance, f is the frequency, $F_C$ is the corner frequency, and $Z_{DC}$ is the beginning impedance.

14. The method as recited in claim 13, wherein an equivalent frequency is calculated by the formula $F_{EQ}=0.35/T_{RISE}$, wherein $F_{EQ}$ is the equivalent frequency, $T_{RISE}$ is a rise time for a clock signal, and wherein $F_{EQ}$ defines the frequency content of said rise time for said clock signal.

15. The method as recited in claim 14, wherein said corner frequency is equal to said equivalent frequency when said equivalent frequency and the frequency of said clock signal are of the same order of magnitude.

16. The method as recited in claim 14, wherein said corner frequency is calculated by the formula $F_C=0.125*F_{CLK}$ when said equivalent frequency is of a different order of magnitude than the frequency of said clock signal, wherein $F_C$ is the corner frequency and $F_{CLK}$ is the frequency of the clock signal.

17. The method as recited in claim 11, wherein a specific quantity of capacitors for a particular frequency is chosen based on the formula $N=ESR/Z_T(f)$, wherein N is the specific quantity of capacitors for said particular frequency, ESR is the equivalent series resistance for one of said specific quantity of capacitors, and $Z_T(f)$ is the target impedance for said given frequency, where f is the particular frequency.

18. The method as recited in claim 17, wherein N is rounded up to the next highest integer value.

19. The method as recited in claim 11, wherein said electrical characteristics include a rated capacitance value, a mounted inductance value, and an equivalent series resistance for each of said decoupling capacitors.

20. The method as recited in claim 19, wherein said mounted inductance value provides an indication of a resonance frequency for a particular decoupling capacitor.

21. A system for determining the desired decoupling capacitors for a power distribution system, the system comprising:
    a computer system configured to:
    perform a simulation of operation of an electronic circuit using a model of said electronic circuit, said electronic circuit having a power distribution system;
    select a frequency range for determining a target impedance of the electronic circuit, wherein said frequency range includes frequencies from a first frequency up to a corner frequency;
    select decoupling capacitors from a database, said selecting based on electrical characteristics of said decoupling capacitors, wherein said database includes information for a plurality of decoupling capacitors, wherein each of said plurality of decoupling capacitors has unique electrical characteristics;
    select one or more specific locations in said electronic circuit for calculating transfer impedance values based on said model of said electronic circuit, wherein said transfer impedance values are a function of frequency, and wherein said one or more specific locations correspond to physical locations of decoupling capacitors in said electronic circuit;
    determining the transfer impedance values at said one or more specific locations; and
    compare the transfer impedance values resulting from said simulating to the target impedance in order to verify that the transfer impedance values are less than or equal to the target impedance, wherein the target impedance varies as a function of frequency.

22. The system as recited in claim 21, wherein said computer system is further configured to determine physical location of said decoupling capacitors ins said electronic circuit, said physical locations corresponding to said one or more specific locations for calculating transfer impedance values.

23. The system as recited in claim 22, wherein said computer system is further configured to determine a beginning impedance, wherein said beginning impedance is determined for a frequency of 0 Hz.

24. The system as recited in claim 23, wherein said target impedance is determined by the formula $Z_T(f)=Z_{DC}*[1+(f/F_C)]$, wherein $Z_T(f)$ is the target impedance, f is the frequency, $F_C$ is the corner frequency, and $Z_{DC}$ is the beginning impedance.

25. The system as recited in claim 24, wherein an equivalent frequency is calculated by the formula $F_{EQ}=0.35/T_{RISE}$, wherein $F_{EQ}$ is the equivalent frequency, $T_{RISE}$ is a rise time for a clock signal, and wherein $F_{EQ}$ defines the frequency content of said rise time for said clock signal.

26. The system as recited in claim 25, wherein said corner frequency is equal to said equivalent frequency when said equivalent frequency and the frequency of said clock signal are of the same order of magnitude.

27. The system as recited in claim 25, wherein said corner frequency is calculated by the formula $F_C=0.125*F_{CLK}$ when said equivalent frequency is of a different order of magnitude than the frequency of said clock signal, wherein $F_C$ is the corner frequency and $F_{CLK}$ is the frequency of the clock signal.

28. The system as recited in claim 22, wherein said computer system is further configured to determine said specific quantity of capacitors for a particular frequency based on the formula $N=ESR/Z_T(f)$, wherein N is the specific quantity of capacitors for said particular frequency, ESR is the equivalent series resistance for one of said specific quantity of capacitors, and $Z_T(f)$ is the target impedance for the particular frequency, where f is the particular frequency.

29. The system as recited in claim 28, wherein N is rounded up to the next highest integer value.

30. The system as recited in claim 21, wherein said unique electrical characteristics include a rated capacitance value, a mounted inductance value, and an equivalent series resistance for each of said decoupling capacitors.

31. The system as recited in claim 30, wherein said mounted inductance values provides and indication of a resonance frequency for a particular decoupling capacitor.

* * * * *